US007485409B2

(12) United States Patent
Nagashima

(10) Patent No.: US 7,485,409 B2
(45) Date of Patent: Feb. 3, 2009

(54) PLANOGRAPHIC PRINTING PLATE PRECURSOR

(75) Inventor: Akira Nagashima, Shizuoka-ken (JP)

(73) Assignee: FujiFilm Corporation, Tokyo (JP)

( * ) Notice: Subject to any disclaimer, the term of this patent is extended or adjusted under 35 U.S.C. 154(b) by 134 days.

(21) Appl. No.: 11/231,850

(22) Filed: Sep. 22, 2005

(65) Prior Publication Data

US 2006/0068321 A1 Mar. 30, 2006

(30) Foreign Application Priority Data

Sep. 27, 2004 (JP) ............................ 2004-280463

(51) Int. Cl.
*G03F 7/039* (2006.01)
*G03F 7/09* (2006.01)
*G03C 1/77* (2006.01)
*G03C 1/73* (2006.01)

(52) U.S. Cl. ................. 430/271.1; 430/278.1; 430/302; 430/326; 430/944; 430/905; 430/907; 430/927

(58) Field of Classification Search .............. 430/270.1, 430/302, 944, 945; 101/453, 463.1
See application file for complete search history.

(56) References Cited

U.S. PATENT DOCUMENTS 6,074,802 A * 6/2000 Murata et al. ............ 430/270.1
6,190,825 B1 * 2/2001 Denzinger et al. .......... 430/192
6,475,698 B2 * 11/2002 Monk et al. .............. 430/270.1
6,893,783 B2 * 5/2005 Kitson et al. .................. 430/15
7,060,412 B2 * 6/2006 Bolli et al. ............... 430/270.1
2001/0019809 A1 * 9/2001 Monk et al. .............. 430/270.1
2004/0191678 A1 * 9/2004 Vermeersch et al. ..... 430/270.1

FOREIGN PATENT DOCUMENTS

JP 11-202481 A 7/1999
JP 2002-517786 A 6/2002
WO WO 99/63407 A1 12/1999

* cited by examiner

*Primary Examiner*—Sin J. Lee
(74) *Attorney, Agent, or Firm*—Sughrue Mion, PLLC

(57) ABSTRACT

The present invention provides a planographic printing plate precursor including a support and a positive recording layer formed on the support and containing: (A) a polymer having a structural unit represented by the following general formula (1), (B) a photo-thermal converting agent, and (C) an amino compound having a methylol group or an alkoxymethyl group; and a positive recording layer whose solubility in an alkaline developer is improved by exposure to light or by heating.

General formula (1)

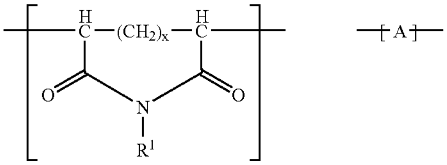

In general formula (1), $R^1$ represents an alkyl group or a cyclic group, x represents 0 or 1, and A represents a bivalent bonding group. According to the invention, a positive planographic printing plate precursor for use with infrared lasers having excellent chemical resistance and wide image development latitude can be obtained.

18 Claims, No Drawings

PLANOGRAPHIC PRINTING PLATE PRECURSOR

CROSS-REFERENCE TO RELATED APPLICATION

This application claims priority under 35 USC 119 from Japanese Patent Application No. 2004-280463, the disclosure of which is incorporated by reference herein.

BACKGROUND OF THE INVENTION

1. Field of the Invention

The present invention relates to a positive planographic printing plate precursor having improved solubility in an aqueous alkaline solution after exposure to infrared light, and more specifically relates to a positive planographic printing plate precursor capable of directly making a plate by scanning with an infrared laser light based on digital signals from computers and the like, that is, capable of direct plate-making.

2. Description of the Related Art

Lasers have developed remarkably in recent years, particularly, there has been progress in higher-output smaller-sized solid-state lasers and semiconductor lasers having a light emission region in the near-infrared to infrared regions. Accordingly, such lasers are extremely useful as exposure light sources for direct plate-making using digital data from computers and the like.

The materials for making positive planographic printing plates for use with infrared lasers employ an infrared laser having a light emission region in the infrared region as an exposure light source, and include a binder resin soluble in an aqueous alkaline solution, a light-absorbing heat-generating IR dye and the like as essential components. The IR dye and the like in the materials function as a dissolution inhibitor for substantially lowering the solubility of the binder resin in the unexposed areas (image areas) due to the interaction of the IR dye and the like with the binder resin. On the other hand, when these materials are exposed to infrared laser light, in the exposed areas (non-image areas), the IR dye and the like absorbs the light and generate heat which weakens the interaction between the IR dye and the like and the binder resin. Accordingly, during development, the exposed areas (non-image areas) are dissolved in an alkaline developer and a planographic printing plate is formed.

However, these materials for positive planographic printing plates for use with infrared lasers have problems since the binder resin thereof must have higher solubility in a solvent such as an alkaline developer, as compared with the materials for a positive planographic printing plate material for use with ultraviolet light exposure. These problems are poorer endurance of the plate against a plate cleaner which is used when ink adherence deteriorates during printing, which results in dissolution of photosensitive components when the surface of the plate is wiped by the plate cleaner.

For improving endurance of the plate against the plate cleaner, a photosensitive composition using a polymer containing a structural unit having a specified functional group capable of forming a hydrogen bond to a photosensitive layer has been proposed (for example, refer to the specification of U.S. Pat. No. 6,475,692), for which improvement in endurance against the plate cleaner has been reported.

However, the positive planographic printing plate precursor for use with infrared lasers described above has a problem in that the strength of the photosensitive layer itself is low and printing endurance is poor. Further, although the polymer described in the patent literature has a function of widening the difference in alkaline solubility (discrimination) between the exposed and unexposed areas, the effect is insufficient and a technique is desired for further improving the stability of development (image development latitude) in spite of variations in usage conditions.

Further, although a technique of adding a specified surfactant to a positive recording layer has been proposed (for example, refer to Japanese Patent Application Laid-Open No. 2002-122982) with an aim of improving the discrimination, the surface of the recording layer is then rendered hydrophilic due to the inclusion of a hydrophilic surfactant in the recording layer, thus resulting in concerns about a lowering of resistance to alkaline developer in the image area.

SUMMARY OF THE INVENTION

An object of the present invention is to overcome the drawbacks of the conventional art by providing a positive planographic printing plate precursor for use with infrared lasers, the plate having a recording layer formed as a firm film of excellent chemical resistance and resistance to alkaline developer, the plate also rapidly losing resistance to alkaline developer by exposure to infrared light to become a positive planographic printing plate precursor having excellent printing endurance and chemical resistance.

The inventors have found that the abovementioned objective can be achieved by the combined use of a polymer having a specified structural unit and a specified cross linking agent, and have accomplished the present invention.

More specifically, a planographic printing plate precursor of the present invention has: a support; and a positive recording layer disposed on the support, and the positive recording layer including (A) a polymer having a structural unit represented by the following general formula (1), (B) a photothermal converting agent, and (C) an amino compound having a methylol group or alkoxy methyl group, wherein solubility in an alkaline developer of the positive recording layer is improved by exposure to light or by heating.

General formula (1)

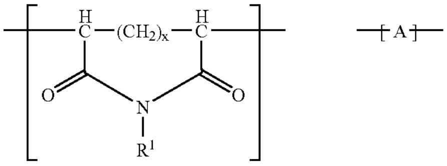

In general formula (1), $R^1$ represents an alkyl group or a cyclic group, x represents 0 or 1, and A represents a bivalent connection group.

In a planographic printing plate precursor according to the present invention, the polymer having a maleimide structure contained in the positive recording layer has excellent resistance to the alkaline developer by itself. In addition, a strong hydrogen bonding interaction is formed between a ring structure formed with nitrogen atoms and oxygen atoms of the polymer of (A) and the amino compound of (C) having the methylol group or alkoxy methyl group used in combination, whereby a high solubility-suppressing function is provided. Accordingly, a film having remarkably excellent alkaline developer resistance and chemical resistance is formed.

On the other hand, such an interaction is easily eliminated or released by exposure to light or heat, and when the interaction is eliminated, the hydrophilic property inherent in polymer of (A) or amino compound of (C) is expressed and they rapidly dissolve in the developer.

Accordingly, in the planographic printing plate precursor having the positive recording layer described above, the unexposed areas maintain a firm film having excellent resistance to alkaline developer and chemical resistance. On the other hand, in the exposed areas, solubility in the developer is remarkably improved due to the elimination of the interaction and the hydrophilicity inherent in the compound. As a result, there is obtained a large difference in alkaline developer solubility of the unexposed areas and exposed areas, and excellent reproducibility for image formation and printing endurance.

In the planographic printing plate precursor of the present invention, a firm film having excellent chemical resistance and resistance to alkaline developer is formed in the unexposed areas. However, after exposure to infrared light, the exposed areas have remarkably improved solubility in the developer.

Accordingly, the present invention enables the provision of a positive planographic printing plate precursor for use with infrared lasers, such plate having wide image development latitude and excellent chemical resistance and printing endurance.

DETAILED DESCRIPTION OF THE INVENTION

The planographic printing plate precursor according to the present invention has a support and a positive recording layer disposed on the support and containing: (A) a polymer having a structural unit represented by general formula (1) (hereinafter referred to as "specified maleimide polymer" where appropriate), (B) a photo-thermal converting agent and (C) an amino compound having a methylol group or alkoxymethyl group (hereinafter referred to as "specified amino compound" where appropriate), wherein the solubility of the positive recording layer in an alkaline developer is improved by exposure to light or by heating.

Each of the components contained in the recording layer of the planographic printing plate precursor according to the invention is described successively.

[(A) Specified Maleimide Polymer]

The specified maleimide polymer used in the present invention has a structural unit represented by the following general formula (1).

General formula (1)

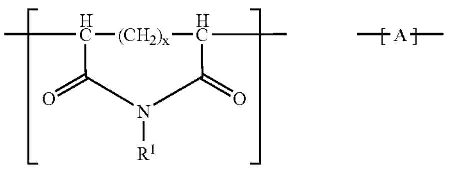

In general formula (1), $R^1$ represents an alkyl group or a cyclic group.

When $R^1$ represents an alkyl group, the alkyl group may have any one from among a linear structure, a branched chain, or a ring structure. More specifically, the alkyl group has preferably from 1 to 20 carbon atoms, more preferably from 1 to 16 carbon atoms, and further preferably from 1 to 12 carbon atoms.

When $R^1$ represents a cyclic group, the cyclic group includes an aliphatic cyclic group, an aromatic cyclic group, or a heterocyclic group.

The aliphatic cyclic group is selected from a cycloalkyl group, a cycloalkenyl group or a cycloalkynyl group, and the number of ring atoms is preferably 5 or 6, with 6 being particularly preferable. As the aliphatic cyclic group, a cycloalkyl group is preferred and, specifically, cyclopentyl and cyclohexyl are preferred, with cyclohexyl being particularly preferred.

The aromatic ring group is preferably a phenyl group.

The alkyl group and the cyclic group may each further have a substituent. The substituent that can be introduced includes, for example, a hydroxyl group; an alkoxy group, a hydroxyalkyloxy group, and a $—SO_2NR^2R^3$ group each of which may further have a substituent (in which R2 and $R^3$ each independently represents a hydrogen atom or an alkyl group, but preferably a hydrogen atom). Among these substituents, the preferred substituents are the hydroxyl group and the $—SO_2NR^2R^3$ group.

When $R^1$ is a phenyl group, the substituent to be introduced is preferably introduced at the fourth position.

Further, although the alkyl group or the cyclic group may have one or more optional substituents as described above, they are preferably not substituted or only one substituent is introduced.

When introducing a substituent into a polymer having the structural unit represented by general formula (1) in order to add other functions, it can be introduced as the substituent for the alkyl group or the cyclic group which are $R^1$. A functional group including a radiation-susceptible atom or group, a functional group which increases heat sensitivity, a dye-containing group, a group containing an ethylenically unsaturated double bond such as acrylate and the like, a group which improves adhesion of the polymer compound to the support, and the like, can be included as such functional groups.

In general formula (1), x represents 0 or 1, and preferably x is 0.

In general formula (1), A represents a bivalent connection group. This bivalent connection group includes, suitably, an alkylene group, a connection group represented by the following general formula (2) or a connection group represented by the following general formula (3).

General formula (2)

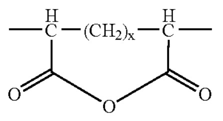

General formula (3)

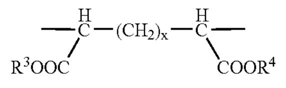

In general formula (2) and general formula (3), x each independently represents 0 or 1. In general formula (3), $R^3$ and $R^4$ each independently represents a hydrogen atom or an alkyl group.

When A in the general formula (1) is an alkylene group, the alkylene group preferably has from 1 to 10 carbon atoms, more preferably from 1 to 6 carbon atoms, and further preferably from 1 to 4 carbon atoms. Most preferably, it is $—CHR^2—CH_2—$ (here, $R^1$ represents a hydrogen atom or a substituent similar to that mentioned below as a substituent that can be introduced into the alkylene group).

While the alkylene group may further have a substituent, two or more substituents introduced in the alkylene group are not connected to each other to form a ring structure. Further, the alkylene group has no cycloaliphatic hydrocarbon structure in the structure thereof.

The bivalent substituent may further have a substituent and examples of the substituent that can be introduced include a halogen atom, a hydroxy group, an alkyl group, an alkoxy group, or a phenyl group. Among them, the alkoxy group and the phenyl group are preferred.

Further, the bivalent substituent may have one or more optional substituent(s) and it is preferred that the group is not substituted or only one substituent is introduced.

A in general formula (1) is preferably an alkylene group, and the alkylene group is preferably not substituted or only one substituent is introduced to a carbon atom constituting the vinyl group.

Although the polymer having the structural unit represented by general formula (1) may be constituted only with the structural unit described above, it may also contain other structural units. Examples of other structural units that can be combined include (meth)acrylic acid and the like. The content of the structural unit represented by general formula (1) is preferably 5 mass % or more, and more preferably 10 mass % or more with respect to the entire polymer.

The weight-average molecular weight of the specified maleimide polymer used herein is preferably from 1,000 to 500,000, more preferably from 2,000 to 400,000, further preferably from 10,000 to 300,000, and particularly preferably from 100,000 to 200,000.

The molecular weight of the specified maleimide polymer relating to the present invention can be selected optionally within the range described above, depending on the purpose.

The specified maleimide polymer can be obtained, for example, by the method described in Japanese National-Phase Application No. 2002-517786, and the polymers and modified products described therein can also be used suitably in a positive recording layer of the present invention.

It is preferable that the specified maleimide in the present invention is substantially insoluble at 25° C. to one or more, preferably at least two, and more preferably at least three of the following solvents: toluene, water, ethanol, chloroform, tetrahydrofuran, and methyl ethyl ketone. Specifically, the solubility of the specified maleimide polymer in the invention is to be 200 g/l or less for one or more of the solvent(s) described above, preferably 100 g/l or less, more preferably 50 g/l or less, and particularly preferably 10 g/l or less.

The content of the specified maleimide polymer in the present invention is preferably within a range from 5 to 90 mass %, and more preferably within a range from 20 to 80 mass % based on the entire solid content of the composition constituting the recording layer in view of the sensitivity and the durability of the formed film.

In the present invention, one or more of the specified maleimide polymers can be suitably mixed and used.

[(B) Photo-thermal Converting Agent]

It is necessary for the recording layer according to the present invention to contain a photo-thermal converting agent (B) in addition to the specified maleimide polymer (A).

Although any compound used for image formation that generates heat by exposure to light from a light source can be used as the photo-thermal converting agent utilized in the present invention, it is preferable to use an infrared light absorbent which has a light absorption region in an infrared region of 700 nm or more, preferably 750 to 1200 nm, and which performs a photo-thermal conversion with light in the range of the wavelengths described above since images are formed by exposure to infrared laser light in the planographic printing plate precursor of the present invention; specifically, various dyes or pigments that absorb the light in the wavelength range described above to generate heat can be used.

The dyes may be commercially available ones and known ones described in publications such as "Dye Handbook" (edited by the Society of Synthesis Organic Chemistry, Japan, and published in 1970). Specific examples thereof include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes, metal thiolate complexes, oxonol dyes, diimonium dyes, aminium dyes, and croconium dyes.

Preferable examples of the dye include cyanine dyes described in JP-A Nos. 58-125246, 59-84356, 59-202829, and 60-78787; methine dyes described in JP-A Nos. 58-173696, 58-181690, and 58-194595; naphthoquinone dyes described in JP-A Nos. 58-112793, 58-224793, 59-48187, 59-73996, 60-52940, and 60-63744; squarylium dyes described in JP-A No. 58-112792; and cyanine dyes described in GB Patent No. 434,875.

Other preferable examples of the dye include near infrared absorbing sensitizers described in U.S. Pat. No. 5,156,938; substituted arylbenzo(thio)pyrylium salts described in U.S. Pat. No. 3,881,924; trimethinethiapyrylium salts described in JP-A No. 57-142645 (U.S. Pat. No. 4,327,169); pyrylium type compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds described in Japanese Patent Application Publication (JP-B) Nos. 5-13514 and 5-19702.

Additional preferable examples of the dye include near infrared absorbing dyes represented by formulae (I) and (II) as described in U.S. Pat. No. 4,756,993.

Among these dyes, particularly preferable are cyanine dyes, phthalocyanine dyes, oxonol dyes, squarylium dyes, pyrylium salts, thiopyrylium dyes, and nickel thiolate complexes. Dyes represented by the following general formulae (a) to (e) are also preferable since such dyes are excellent in terms of photothermal conversion efficiency. The cyanine dyes represented by the following general formula (a) are most preferable for the following reason: when the dyes are used in the photosensitive composition of the invention, the dyes manifest a high degree of interaction with the alkali-soluble resin, and the dyes are also excellent in terms of stability and economy.

General Formula (a)

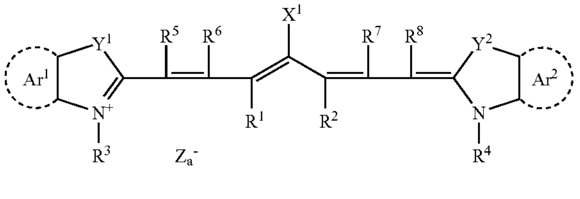

In general formula (a), $X^1$ represents a hydrogen atom, a halogen atom, $—NPh_2$, $X^2—L^1$ (wherein $X^2$ represents an oxygen atom or a sulfur atom, $L^1$ represents a hydrocarbon group having 1 to 12 carbon atoms, an aromatic cyclic group having a heteroatom, or a hydrocarbon group containing a heteroatom and having 1 to 12 carbon atoms, and the heteroatom referred to herein is N, S, O, a halogen atom, or Se), or a group represented by the following:

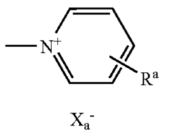

where $Xa^-$ has the same definition as $Za^-$, which will be described at a later time, and $R^a$ represents a substituent selected from a hydrogen atom, an alkyl group, an aryl group, a substituted or unsubstituted amino group, or a halogen atom;

In the general formula (a), $R^1$ and $R^2$ each independently represents a hydrocarbon group having 1 to 12 carbon atoms, and from the viewpoint of the storage stability of the photosensitive composition of the invention when it is used in a coating solution for forming a recording layer of a planographic printing plate precursor, it is preferable that $R^1$ and $R^2$ each independently represents a hydrocarbon group having 2 or more carbon atoms, and more preferably $R^1$ and $R^2$ are bonded to each other to form a 5-membered or 6-membered ring.

$Ar^1$ and $Ar^2$, which may be the same or different, each represent an aromatic hydrocarbon group which may have a substituent. Preferable examples of the aromatic hydrocarbon group include benzene and naphthalene rings. Preferable examples of the substituent include hydrocarbon groups having 12 or less carbon atoms, halogen atoms, and alkoxy groups having 12 or less carbon atoms.

$Y^1$ and $Y^2$, which may be the same or different, each represents a sulfur atom, or a dialkylmethylene group having 12 or less carbon atoms.

$R^3$ and $R^4$, which may be the same or different, each represents a hydrocarbon group which has 20 or less carbon atoms and may have a substituent. Preferable examples of the substituent include alkoxy groups having 12 or less carbon atoms, a carboxyl group, and a sulfo group. $R^5$, $R^6$, $R^7$ and $R^8$, which may be the same or different, each represents a hydrogen atom, or a hydrocarbon group having 12 or less carbon atoms, and since the raw materials thereof can easily be obtained, each preferably represents a hydrogen atom.

$Za^-$ represents a counter anion. However, in a case where the cyanine dye represented by general formula (a) has an anionic substituent in the structure thereof and there is accordingly no need to neutralize electric charges in the dye, $Za^-$ is not required. From the viewpoint of the storage stability of the recording layer coating solution, $Za^-$ is preferably an ion of a halogen, perchlorate, tetrafluroborate, hexafluorophosphate, carboxylate or sulfonate. Particularly preferable are ions of perchlorate, hexafluorophosphate, and arylsulfonate.

Specific examples of the cyanine dye represented by general formula (a), which can be preferably used in the invention, include, in addition to the examples shown below, dyes in JP-A No. 2001-133969 (paragraphs [0017] to [0019]), JP-A No. 2002-40638 (paragraphs [0012] to [0038]), and JP-A No. 2002-23360 (paragraphs [0012] to [0023]).

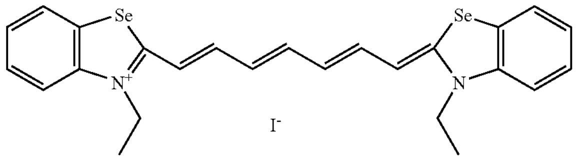

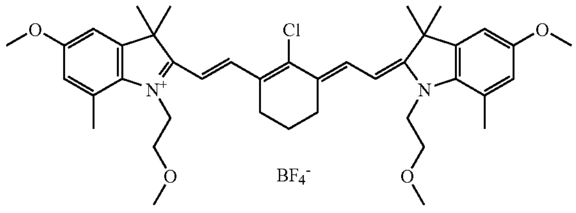

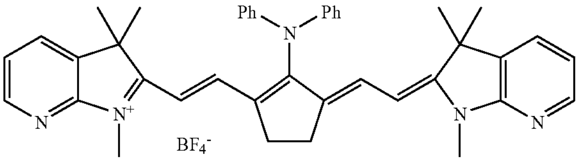

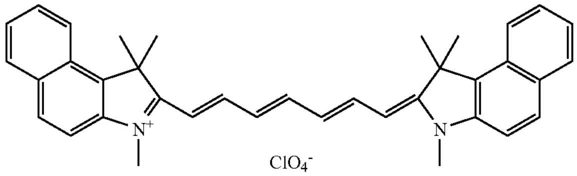

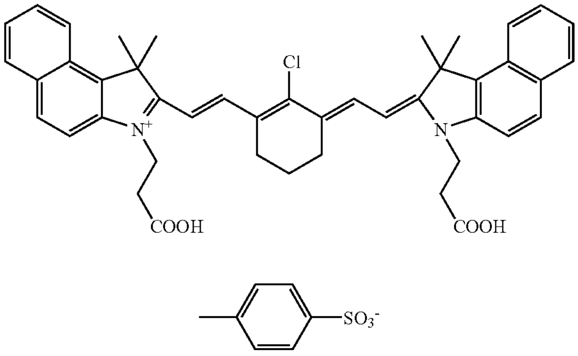

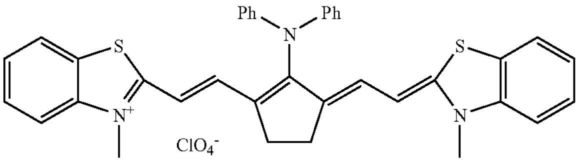

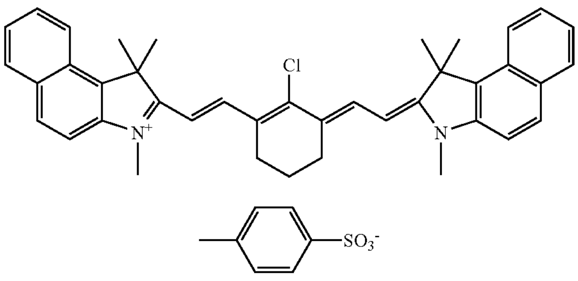

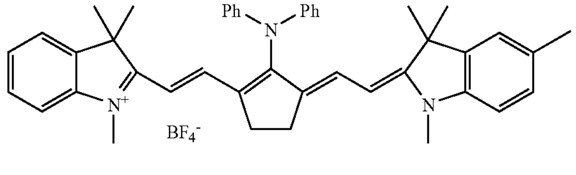

-continued

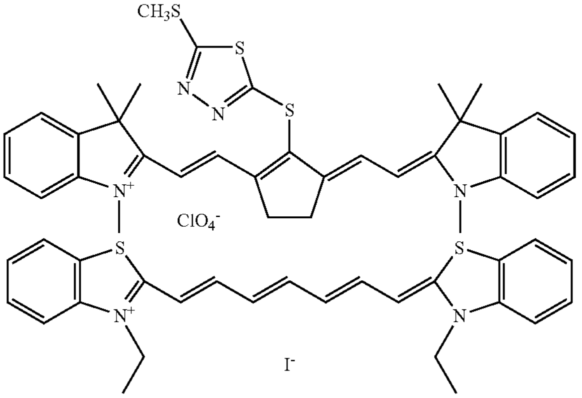

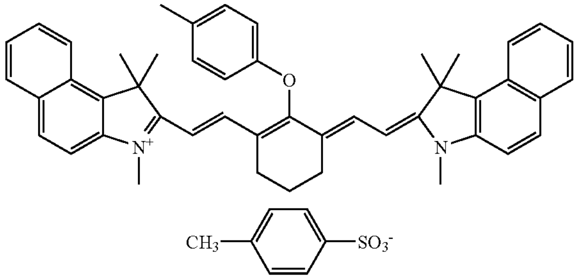

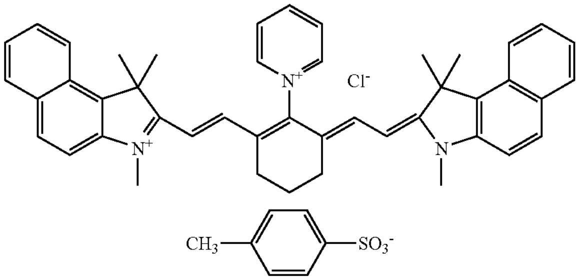

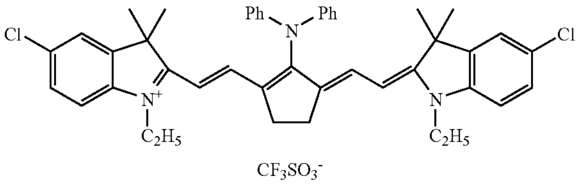

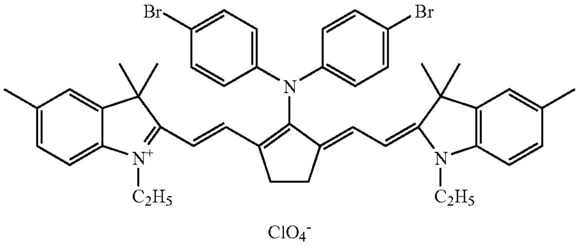

General formula (b)

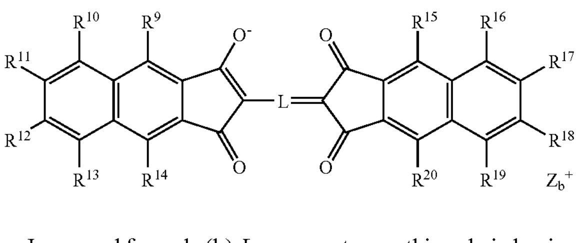

In general formula (b), L represents a methine chain having 7 or more conjugated carbon atoms, and the methine chain may have one or more substituent. The substituents may be bonded to each other to form a cyclic structure. $Zb^+$ represents a counter cation. Preferable examples of the counter cation include ammonium, iodonium, sulfonium, phosphonium and pyridinium ions, and alkali metal cations (such as $Ni^+$, $K^+$ and $Li^+$).

$R^9$ to $R^{14}$ and $R^{15}$ to $R^{20}$ each independently represents a substituent selected from hydrogen atom, halogen atom, and cyano, alkyl, aryl, alkenyl, alkynyl, carbonyl, thio, sulfonyl, sulfinyl, oxy and amino groups; or a substituent obtained by combining two or three from among these substituents. Two or three out of $R^9$ to $R^{14}$ and $R^{15}$ to $R^{20}$ may be bonded to each other to form a cyclic structure.

A dye wherein L in general formula (b) represents a methine chain having 7 conjugated carbon atoms, and each of $R^9$ to $R^{14}$ and $R^{15}$ to $R^{20}$ represents a hydrogen atom, is preferable since such a dye can be easily obtained and exhibits advantageous effects.

Specific examples of the dye represented by general formula (b), and which can be preferably used in the invention, are illustrated below.

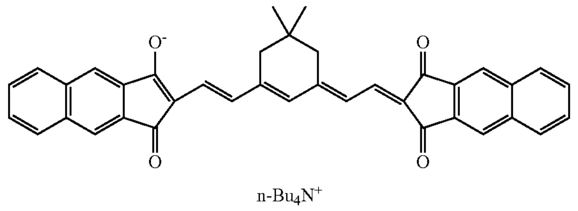

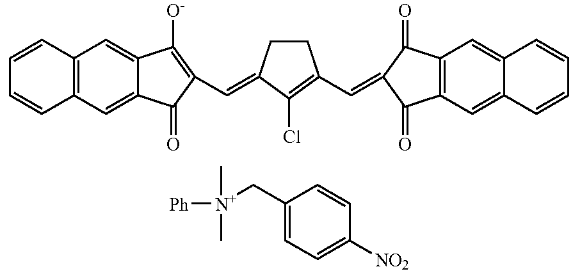

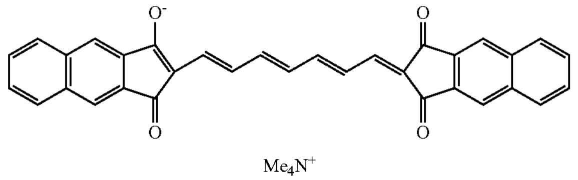

General formula (c)

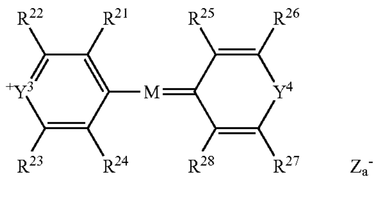

In general formula (c), $Y^3$ and $Y^4$ each independently represent an oxygen, sulfur, selenium or tellurium atom; M represents a methine chain having 5 or more conjugated carbon atoms; $R^{21}$ to $R^{24}$ and $R^{25}$ to $R^{28}$, which may be the same or different, each represents a hydrogen or halogen atom, or a cyano, alkyl, aryl, alkenyl, alkynyl, carbonyl, thio, sulfonyl, sulfinyl, oxy or amino group; and $Za^-$ represents a counter anion, and has the same meaning as $Za^-$ in general formula (a).

Specific examples of the dye which is represented by general formula (c) and which can be preferably used in the invention, are illustrated below.

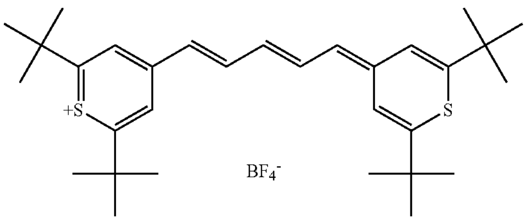

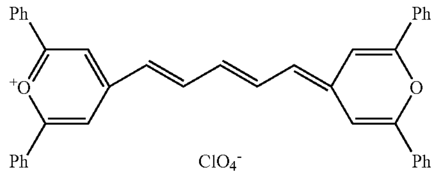

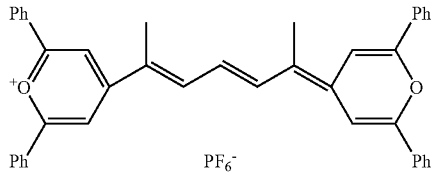

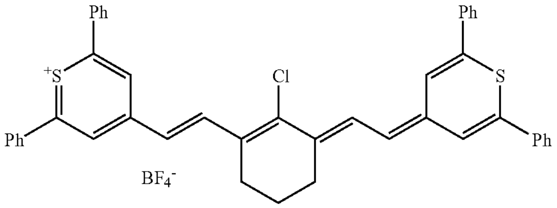

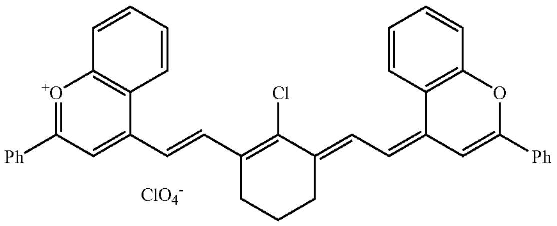

General formula (d)

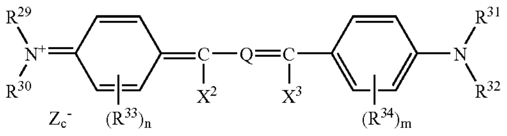

In general formula (d), $R^{29}$ to $R^{31}$ each independently represents a hydrogen atom, an alkyl group or an aryl group; $R^{33}$ and $R^{34}$ each independently represents an alkyl group, a substituted oxy group, or a halogen atom; n and m each independently represents an integer of 0 to 4; and $R^{29}$ and $R^{30}$, or $R^{31}$ and $R^{32}$ may be bonded to each other to form a ring, or $R^{29}$ and/or $R^{30}$ may be bonded to $R^{33}$ to form a ring and $R^{31}$ and/or $R^{32}$ may be bonded to $R^{34}$ to form a ring. When plural $R^{33}$'s and $R^{34}$'s are present, $R^{33}$'s may be bonded to each other to form a ring, or $R^{34}$'s may be bonded to each other to form a ring.

$X^2$ and $X^3$ each independently represents a hydrogen atom, an alkyl group or an aryl group, and at least one of $X^2$ and $X^3$ represents a hydrogen atom or an alkyl group.

Q represents a trimethine group or a pentamethine group which may have a substituent, and may be combined with an bivalent linking group to form a cyclic structure. $Zc^-$ represents a counter anion and has the same meanings as $Za^-$ in general formula (a).

Specific examples of the dye represented by general formula (d) and which can be preferably used in the invention, are illustrated below.

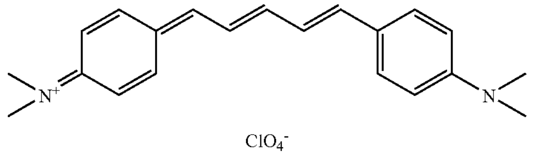

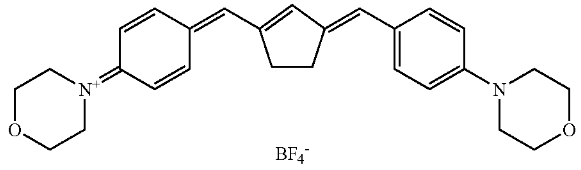

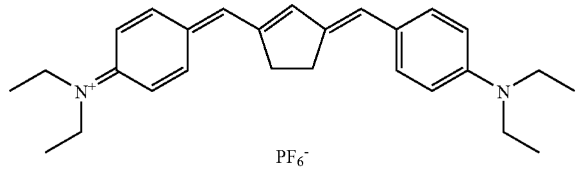

General formula (e)

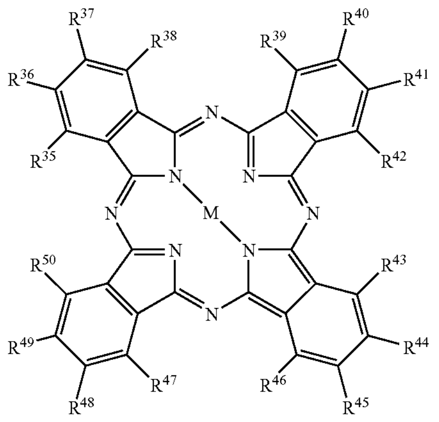

In general formula (e), $R^{35}$ to $R^{50}$ each independently represents a hydrogen or halogen atom, or a cyano, alkyl, aryl, alkenyl, alkynyl, hydroxyl, carbonyl, thio, sulfonyl, sulfinyl, oxy or amino group, or an onium salt structure, each of which may have a substituent; M represents two hydrogen atoms, a metal atom, a halo metal group, or an oxy metal group. Examples of the metal contained therein include atoms in IA, IIA, IIIB and IVB groups in the periodic table, transition metals in the first, second and third periods therein, and lanthanoid elements. Among these examples, preferable are copper, magnesium, iron, zinc, cobalt, aluminum, titanium, and vanadium.

Specific examples of the dye represented by general formula (e) and which can be preferably used in the invention, are illustrated below.

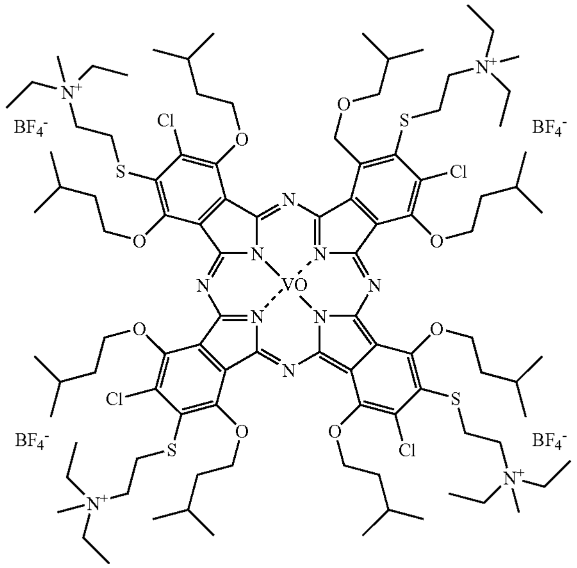

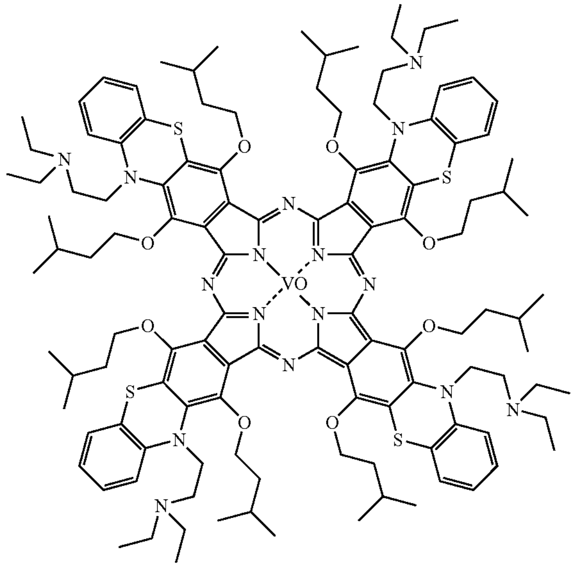

The pigment used as the infrared absorbent in the invention may be a commercially available pigment or a pigment described in publications such as Color Index (C.I.) Handbook, “Latest Pigment Handbook” (edited by Japan Pigment Technique Association, and published in 1977), “Latest Pigment Applied Technique” (by CMC Publishing Co., Ltd. in 1986), and “Printing Ink Technique” (by CMC Publishing Co., Ltd. in 1984).

Examples of the pigment include black pigments, yellow pigments, orange pigments, brown pigments, red pigments, purple pigments, blue pigments, green pigments, fluorescent pigments, metal powder pigments, and polymer-bonded dyes. Specifically, the following can be used: insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Among these pigments, carbon black is preferable.

These pigments may be used with or without surface treatment. Examples of surface treatment include a method of coating the surface of the pigments with resin or wax; a method of adhering a surfactant onto the surface; and a method of bonding a reactive material (such as a silane coupling agent, an epoxy compound, or a polyisocyanate) to the pigment surface. The surface treatment methods are described in “Nature and Application of Metal Soap” (Saiwai Shobo), “Printing Ink Technique” (by CMC Publishing Co., Ltd. in 1984). And “Latest Pigment Applied Technique” (by CMC Publishing Co., Ltd. in 1986.

The particle size of the pigment is preferably from 0.01 to 10 μm, more preferably from 0.05 to 1 μm, and even more preferably from 0.1 to 1 μm.

The method for dispersing the pigment may be a known dispersing technique used to produce ink or toner. Examples of a dispersing machine, which can be used, include an ultrasonic disperser, a sand mill, an attriter, a pearl mill, a super mill, a ball mill, an impeller, a disperser, a KD mill, a colloid mill, a dynatron, a three-roll mill, and a pressing kneader. Details are described in “Latest Pigment Applied Technique” (by CMC Publishing Co., Ltd. in 1986).

In view of the balance between the sensitivity and the uniformity and durability of the film, the pigments or the dyes described above can be added, with respect to the entire solid content constituting the recording layer, at a ratio of from 0.01 to 50 mass %, preferably from 0.1 to 10 mass %, particularly preferably from 0.5 to 10 mass % in the case of a dye, and particularly preferably from 0.1 to 10 mass % in the case of a pigment.

[(C) Specified Amino Compound]

In the present invention, it is necessary for the recording layer to include the aforementioned specified maleimide polymer (A) and photo-thermal converting agent (B), together with an amino compound (specified amino compound)having a methylol group or an alkoxy methyl group (C).

Here, the specified amino compound is preferably an amino compound having at least two substituents selected from the group consisting of a methylol group and an alkoxy methyl group.

More preferably, the specified amino group in the present invention is preferably an amino compound containing the structure represented by the following general formula (I).

General formula (I)

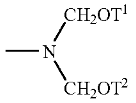

In general formula (I), $T^1$ and $T^2$ each independently represents a hydrogen atom, an alkyl group, an alkenyl group, an acyl group, or an acetyl group.

When $T^1$ and $T^2$ are alkyl groups in general formula (I), the alkyl groups have preferably 1 to 8 carbon atoms, and more preferably 1 to 4 carbon atoms. Specifically, a methyl group, an ethyl group, an iso-propyl group, a tert-butyl group, and the like are preferred.

Further, when $T^1$ and $T^2$ are alkenyl groups, the alkenyl groups have preferably from 2 to 18 carbon atoms, and more preferably 2 to 4 carbon atoms.

Further, when $T^1$ and $T^2$ are acyl groups, the acyl groups have preferably from 12 to 18 carbon atoms, and more preferably from 2 to 4 carbon atoms.

Specific examples of the structure represented by general formula (I) include: a methoxymethylolamine group, a dimethoxymethylamino group, a dimethylolamino group (dihydroxyamino group), a diethoxymethylamino group, or the like.

Examples of the compound having two or more number of the structure represented by general formula (I) within the molecule include: a compound having a melamine skeleton; a compound having a benzoguanamine skeleton; a compound having a glycoluryl skeleton; and a compound having a urea skeleton. Further, it is acceptable to have a condensed product formed by condensing the structure represented by general formula (I) and a compound referred to herein through a bivalent connection group.

Further, in the present invention, from among the amino compounds, the amino compound represented by the following general formula (2) is preferred.

General formula (II)

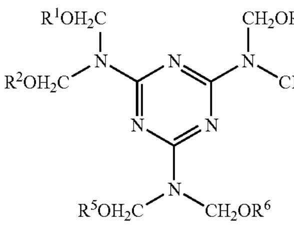

In general formula (II), $R^1$ to $R^6$ each independently represents a hydrogen atom, an alkyl group, an alkenyl group, an acyl group, or an acetyl group.

Here, the hydrogen atom, the alkyl group, the alkenyl group, the acyl group, and the acetyl group in $R^1$ to $R^6$ of general formula (II) are identical to the hydrogen atom, the alkyl group, the alkenyl group, the acyl group, and the acetyl group in $T^1$ and $T^2$ of general formula (I).

Specific examples of specified amino compounds suitably used in the present invention are described, but the present invention is not limited to the specified amino compounds described herein.

(C-1)

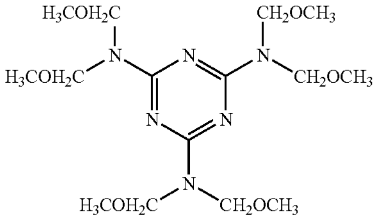

(C-2)

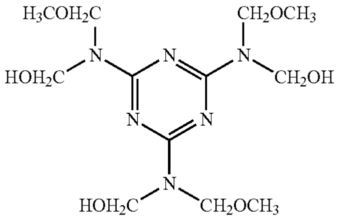

-continued (C-3)

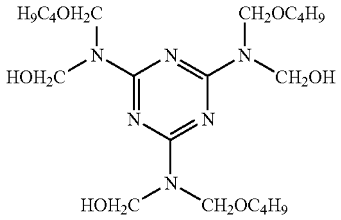

(C-4)

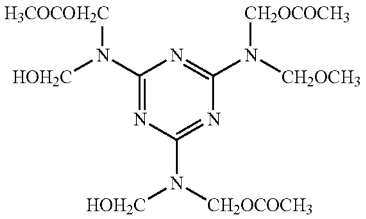

(C-5)

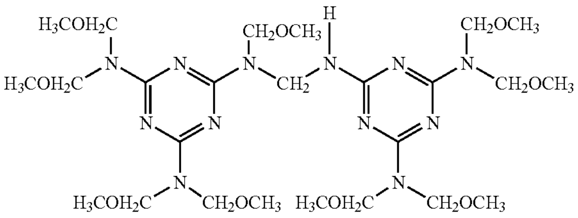

(C-6)

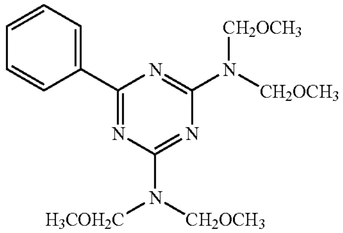

(C-7)

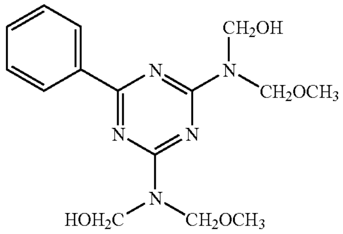

(C-8)

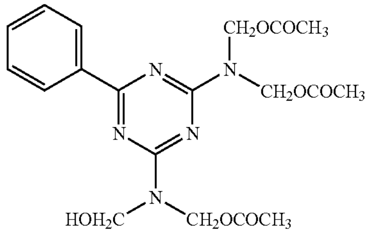

-continued (C-9)

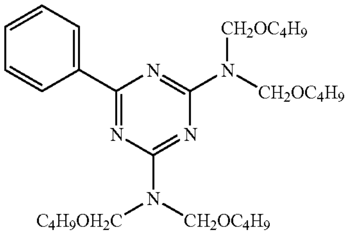

(C-10)

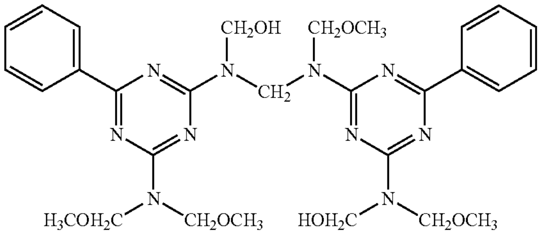

(C-11)

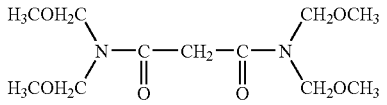

(C-12)

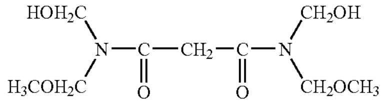

(C-13)

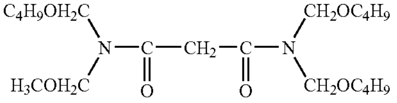

(C-14)

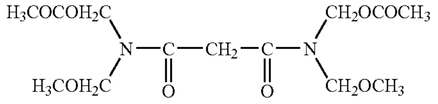

(C-15)

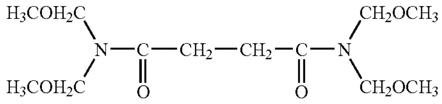

(C-16)

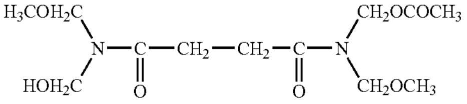

(C-17)

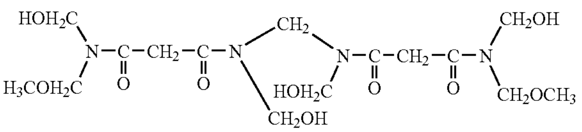

(C-18)

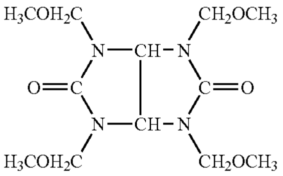

-continued (C-19)

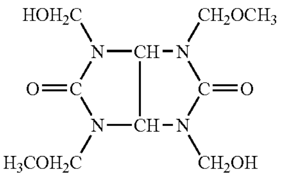

(C-20)

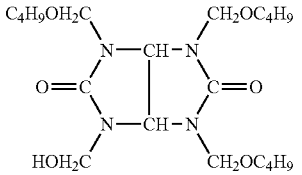

(C-21)

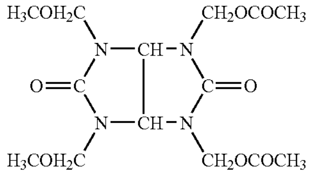

(C-22)

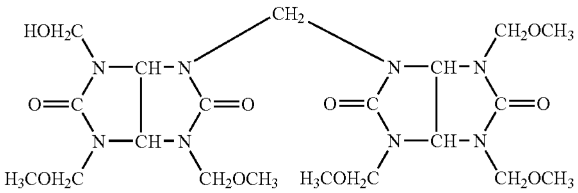

In view of printing endurance and chemical resistance, the specified amino compound in the present invention is preferably added at a ratio of from 0.5 to 30 mass %, and more preferably from 1 to 10 mass %, in relation to the entire solid content constituting the recording layer.

[Other Components]

In the recording layer of the planographic original plating plate according to the invention, if further required, various compounds can be used in combination with the essential components (A) to (C).

For example, resins other than the specified maleimide polymer (A), which are soluble in an aqueous alkaline solution, can be incorporated into the recording layer as required. In this case, there is no restriction as to the other alkaline soluble resins, but general-purpose novolac resins are preferred.

Novolac resins include, for example, phenol formaldehyde resin, m-cresol formaldehyde resin, p-cresol formaldehyde resin, m-/p-mixed cresol formaldehyde resin, phenol/cresol mixed formaldehyde resin (may be any of m-, p-, o-, m-/p-mixture, m-/o-mixture, and o-/p-mixture). They may be used alone or two or more may be used in combination.

Among the novolac resins, those having a weight-average molecular weight of 1500 or more and a number-average molecular weight of 300 or more are preferred. More preferred are those having a weight-average molecular weight of 3,000 to 300,000 and a number-average molecular weight of 500 to 250,000 with a degree of dispersion (weight-average molecular weight/number-average molecular weight) of 1.1 to 10.

Examples of preferred alkaline soluble resins that can be used in combination include those having acidic groups referred to in the following (1) to (6) in the main chain and/or side chain of the polymer.

(1) phenol (—Ar—OH), (2) sulfone amide (—$SO_2NH$—R), (3) substituted sulfoneamido based acid group (hereinafter, referred to as active imido group) [—$SO_2NHCOR$, —$SO_2NHSO_2R$, —$CONHSO_2R$]

(4) carboxylic acid group (—$CO_2H$), (5) sulfonic acid group (—$SO_3H$), and (6) phosphoric acid group (—$OPO_3H_2$)

Ar in the above-mentioned groups (1) to (6) represents a divalent aryl bonding group optionally comprising a substituent group and R represents a hydrocarbon group optionally comprising a substituent group.

Among the alkali-soluble resin comprising the acidic group selected from the above-mentioned (1) to (6), an alkali-soluble resin comprising (1) phenol, (2) sulfone amide, or (3) active imido group is preferable and an alkali-soluble resin comprising (1) phenol or (2) sulfone amide is more preferable in terms of assurance of the sufficient solubility in an alkaline developer, development latitude, and film strength.

As the alkali-soluble resin comprising the acidic group selected from the above-mentioned (1) to (6), the following can be exemplified.

(1) Examples of the alkali-soluble resin comprising phenol group may include novolak resin such as condensation polymers of phenol and formaldehyde; condensation polymers of m-cresol and formaldehyde, condensation polymers of p-cresol and formaldehyde, condensation polymers of m-/p-mixed cresol and formaldehyde, and condensation polymers of phenol, cresol (m-, p-, or m-/p-mixture) and formaldehyde; and condensation copolymers of pyrogallol and acetone. Further, copolymers obtained by copolymerizing compound comprising phenyl groups in the side chains can be exemplified. Or, copolymers obtained by copolymerizing compounds comprising phenyl groups in the side chains can also be used.

As the compounds comprising phenol group, acrylamide, methacrylamide, acrylic acid ester, methacrylic acid ester, or hydroxystyrene can be exemplified.

(2) Examples of the alkali-soluble resin comprising sulfoneamido group may include a polymer obtained by using the minimum component units derived from compounds comprising sulfoneamido group as main constituent components. Examples of such compounds include those having at least one sulfoneamido group comprising at least one hydrogen atom bonded to the nitrogen atom and at least one polymerizable unsaturated group, in the molecules. Among them, low molecular weight compounds comprising acryloyl, allyl, or vinyloxy group as well as substituted or mono-substituted aminosulfonyl group or a substituted sulfonylimino group in molecules are preferable and the following compounds defined by the following (i) to (v) can be exemplified.

Examples thereof include compounds represented by any one of the following general formulae (i) to (v):

General formula (i)

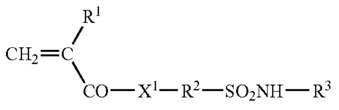

-continued

General formula (ii)

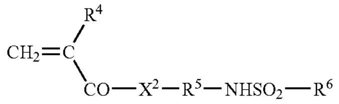

General formula (iii)

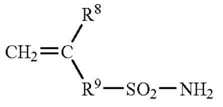

General formula (iv)

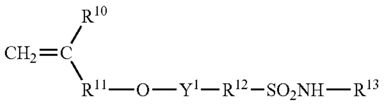

General formula (v)

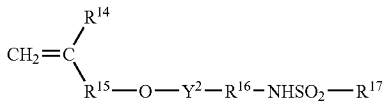

In the general formulae (i) to (v), $X^1$ and $X^2$ each independently represent —O—, or —$NR^7$—; $R^1$ and $R^4$ each independently represent a hydrogen atom, or —$CH_3$; $R^2$, $R^5$, $R^9$, $R^{12}$ and $R^{16}$ each independently represent an alkylene, cycloalkylene, arylene or aralkylene group which may have a substituent and has 1 to 12 carbon atoms; $R^3$, $R^7$ and $R^{13}$ each independently represent a hydrogen atom, or an alkyl, cycloalkyl, aryl or aralkyl group which may have a substituent and has 1 to 12 carbon atoms; $R^6$ and $R^{17}$ each independently represent an alkyl, cycloalkyl, aryl or aralkyl group which may have a substituent and has 1 to 12 carbon atoms; $R^8$, $R^{10}$ and $R^{14}$ each independently represent a hydrogen atom or —$CH_3$; $R^{11}$ and $R^{15}$ each independently represent a single bond, or an alkylene, cycloalkylene, arylene or aralkylene group which may have a substituent and has 1 to 12 carbon atoms; and $Y^1$ and $Y^2$ each independently represent a single bond or —CO—.

Of the compounds represented by the represented by the general formulae (i) to (v), in particular, the following can preferably be used in the invention: m-aminosulfonylphenyl methacrylate, N-(p-aminosulfonylphenyl)methacryl amide and N-(p-aminosulfonylphenyl)acrylamide.

Examples of the alkali-soluble resin having an active imide group in the item (3) include a polymer mainly constituted of a minimum structural unit derived from a compound having an active imide group. Specific examples of such a compound include a compound having in the molecule thereof one or more active imide group and one or more unsaturated groups which can be polymerized with the active imide group(s).

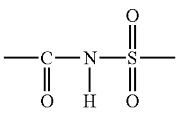

Specifically, N-(p-toluenesulfonyl)methacrylamide, N-(p-toluenesulfonyl)acrylamide and others can be preferably used.

Examples of the alkali-soluble resin having a carboxylic acid group in the item (4) include a polymer mainly constituted of a minimum structural unit derived from a compound having in the molecule thereof one or more carboxylic acid group and one or more unsaturated groups which can be polymerized with the carboxylic acid group(s).

Examples of the alkali-soluble resin having a sulfonic acid group in the item (5) include a polymer mainly constituted of a minimum structural unit derived from a compound having in the molecule thereof one or more sulfonic acid group and one or more unsaturated groups which can be polymerized with the sulfonic acid group(s).

Examples of the alkali-soluble resin having a phosphoric acid group in the item (6) include a polymer mainly constituted of a minimum structural unit derived from a compound having in the molecule thereof one or more phosphoric acid group and one or more unsaturated groups which can be polymerized with the phophoric acid group(s).

The minimum constituent unit comprising acidic group selected from (1) to (6) is not necessarily limited to one particular unit, but those obtained by copolymerizing two or more minimum constituent units comprising the same acidic group or two or more minimum constituent units comprising different acidic groups can also be used.

The above-mentioned copolymer contains the compound having the acidic group selected from (1) to (6) to be copolymerized in an amount preferably 10% by mole or more, more preferably 20% by mole or more. If it is less than 10% by mole, the development latitude tends to be improved insufficiently.

It is possible to use the monomers referred to in the following (ml) to (ml2) as a monomer component to be copolymerized with: a polymerizable monomer having a phenolic hydroxyl group; a polymerizable monomer having a sulfoneamide group; or a polymerizable group having an active imide group. The type of the monomers are not limited to these monomers.

(m1) Acrylic acid esters and methacrylic acid esters having aliphatic hydroxyl groups such as 2-hydroxyethyl acrylate or 2-hydroxyethyl methacrylate.

(m2) Alkyl acrylate such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl methacrylate such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamide or methacrylamide such as acrylamide, methacrylamide, N-methylol acrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacxrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, vinyl butylate, and vinyl benzoate.

(m7) Styrenes such as styrene, α-methylstyrene, methylstyrene, and chloromethylstyrene.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-vinylpyrrolidone, acrylonitrile, and methacrylonitrile.

(m11) Unsaturated imides such as maleimide, N-acryloylacrylamide, N-acetylmethacrylamide, N-propionylmethacrylamide, and N-(p-chlorobenzoyl)methacrylamide.

(m12) Unsaturated carboxylic acid such as acrylic acid, methacrylic acid, maleic anhydride, and itaconic acid.

As the alkaline soluble resin in the present invention, homopolymers or copolymers of the polymerizable monomer having the phenolic hydroxyl group or the polymerizable monomer having the active imide group are preferred; and homopolymers or copolymers of a polymerizable monomer having a sulfonamide group such as m-aminosulfonylphenyl methacrylate, N-(p-aminosulfonylphenyl)methacrylamide, and N-(p-aminosulfonylphenyl)acrylamide are particularly preferred. Further, those having a weight-average molecular weight of 2,000 or more and a number-average molecular weight of 500 or more are preferred. Further preferred are those having a weight-average molecular weight of from 5,000 to 300,000 and a number-average molecular weight of 800 to 250,000 with a degree of dispersion (weight-average molecular weight/number-average molecular weight) of 1.1 to 10. Further, in a case where the alkaline soluble resin in the present invention is a resin such as phenol formaldehyde resin, cresol aldehyde resin, or the like, those having a weight-average molecular weight of 500 to 20,000 and a number-average molecular weight of 200 to 10,000 are preferred.

The alkaline soluble resin may be used alone or two or more may be used in combination, and used in additive amounts of from 5 to 90 mass %, preferably from 10 to 85 mass %, and particularly preferably from 15 to 80 mass % in the entire solid content of the recording layer. When the additive amount of the alkaline soluble resin is insufficient, the durability of the recording layer is worsened when used as the recording layer of a planographic printing plate precursor. If the additive amount is excessive, this substantially reduces the additive amount of "specified maleimide polymer (A)" which is an essential component of the present invention, this being undesirable since it becomes difficult to obtain the effect of the invention.

Further, for adjusting the solubility of the recording layer, it is preferable to add a so-called dissolution inhibitor that improves the function of inhibiting solubility of the aqueous alkaline polymer (alkaline soluble resin) in the developer, such as adding other onium salts, aromatic sulfone compounds, aromatic sulfonate ester compounds, polyfunctional amine compounds, or the like. Among these, the combined use of a substance that is heat-decomposing and substantially lowers the solubility of the alkaline soluble resin in an undecomposed state, such as onium salts, o-quinonediazide compounds, alkyl sulfonate ester, and the like is preferable for the aim of improving the solubility inhibiting property of the image area with regard to the developer.

Preferable examples of the onium salt used in the invention include diazonium salts described in S. I. Schlesinger, Photogr. Sci. Eng., 18, 387 (1974), T. S. Bal et al., Polymer, 21, 423 (1980), and JP-A No. 5-158230; ammonium salts described in U.S. Pat. Nos. 4,069,055 and 4,069,056, and JP-A No. 3-140140; phosphonium salts described in D. C. Necker et al., Macromolecules, 17, 2468 (1984), C. S. Wen et al., Teh, Proc. Conf. Rad. Curing ASIA, p 478 Tokyo, October (1988), and U.S. Pat. Nos. 4,069,055 and 4,069,056; iodonium salts described in J. V. Crivello et al., Macromolecules, 10 (6), 1307 (1977), Chem. & Eng. News, November 28, p 31 (1988), EP No. 104,143, U.S. Pat. Nos. 5,041,358 and 4,491,628, and JP-A Nos. 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 233,567, 297,443 and 297,442, U.S. Pat. Nos. 4,933,377, 3,902,114, 5,041,358, 4,491,628, 4,760,013, 4,734,444 and 2,833,827, and DE Patent Nos. 2,904,626, 3,604,580 and 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); arsonium salts described in C. S. Wen et al., and The Proc. Conf. Rad. Curing ASIA, p 478, Tokyo, October (1988).

Among the onium salts described above, diazonium salts and quaternary ammonium salts are particularly preferred from the viewpoints of solubility inhibiting ability and heat decomposition property. Particularly, the diazonium salt is preferably a diazonium salt represented by the general formula (I) described in Japanese Patent Application Laid-Open No. 5-158230, or a diazonium compound represented by the general formula (1) described in Japanese Patent Application Laid-Open No. 11-143064, and most preferably a diazonium salt represented by the general formula (1) described in Japanese Patent Application Laid-Open No. 11-143064 that has a small absorption wavelength in the visible light region. Further, the quaternary ammonium salt is preferably quaternary ammonium salts described as (1) to (10) in [Ka 5] or [Ka 6] in JP-A No. 2002-229186.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Among these examples, hexafluorophosphoric acid, and alkylaromatic sulfonic acids such as triisopropylnaphthalenesulfonic acid and 2,5-dimethylbezenesulfonic acid are particularly preferable.

The quinonediazide is preferably an o-quinonediazide compound. The o-quinonediazide compound used in the invention is a compound having at least one o-quinonediazide group and having an alkali-solubility increased by being thermally decomposed. The compound may be any one of compounds having various structures.

In other words, the o-quinonediazide compound assists the solubility of the photosensitive material both from the viewpoint of the effects of being thermally decomposed, and thereby losing the function of suppressing the dissolution of the binder, and the effect that the o-quinonediazide itself is changed into an alkali-soluble material.

Preferable examples of the o-quinonediazide compound used in the invention include compounds described in J. Coser, “Light-Sensitive Systems” (John Wiley & Sons. Inc.), pp. 339-352. Particularly preferable are sulfonic acid esters or sulfonamides of o-quinonediazide made to react with various aromatic polyhydroxy compounds or with aromatic amino compounds.

Further preferable examples include an ester made from benzoquinone-(1,2)-diazidesulfonic acid chloride or naphthoquinone-(1,2)-diazide-5-sulfonic acid chloride and pyrogallol-acetone resin, as described in JP-B No. 43-28403; and an ester made from benzoquinone-(1,2)-diazidesulfonic acid chloride or naphthoquinone-(1,2)-diazide-5-sulfonic acid chloride and phenol-formaldehyde resin.

Additional preferable examples include an ester made from naphthoquinone-(1,2)-diazide-4-sulfonic acid chloride and phenol-formaldehyde resin or cresol-formaldehyde resin; and an ester made from naphthoquinone-(1,2)-diazide-4-sulfonic acid chloride and pyrogallol-acetone resin.

Other useful o-quinonediazide compounds are reported in unexamined or examined patent documents, examples of which include JP-A Nos. 47-5303, 48-63802, 48-63803, 48-96575, 49-38701 and 48-13354, JP-B No. 41-11222, 45-9610 and 49-17481, U.S. Pat. Nos. 2,797,213, 3,454,400, 3,544,323, 3,573,917, 3,674,495 and 3,785,825, GB Patent Nos. 1,227,602, 1,251,345, 1,267,005, 1,329,888 and 1,330,932, and DE Pat. No. 854,890.

The amount of onium salt and/or o-quinonediazide compound added as the decomposable dissolution suppresser(s) is preferably from 1 to 10%, more preferably from 1 to 5%, and even more preferably from 1 to 2% by relative to the total solid contents of the recording layer. The onium salts and the o-quinonediazide compounds may be used either independently or in the form of mixtures of two or more thereof.

The amount of additives other than the o-quinonediazide compound added is preferably from 0.1 to 5%, more preferably from 0.1 to 2%, and even more preferably from 0.1 to 1.5% by mass. The additives and the binder used in the invention are preferably incorporated into the same layer.

A dissolution suppresser having no decomposability may be used in combination. Preferable examples thereof include sulfonic acid esters, phosphoric acid esters, aromatic carboxylic acid esters, aromatic disulfones, carboxylic acid anhydrides, aromatic ketones, aromatic aldehydes, aromatic amines, and aromatic ethers, details of which are described in JP-A No. 10-268512; acidic color-developable dyes which have a lactone skeleton, an N,N-diarylamide skeleton or a diarylmethylimino skeleton and also function as a coloring agent, details of which are described in JP-A No. 11-190903; and nonionic surfactants described, details of which are described in JP-A No. 2000-105454.

From the viewpoint of improving sensitivity, preferable examples of additives for use in the uppermost layer of the recording layer include cyclic acid anhydrides, phenols, organic acids, or the like. Further, a surfactant, an image colorant, and a plasticizer, each to be described later, can also be used as additives to the positive recording layer.

As the cyclic acid anhydride, phthalic acid anhydride, tetrahydrophthalic acid anhydride, 3,6-endoxy-4-tetrahydrophthalic acid anhydride, tetrachlorophthalic acid anhydride, maleic acid anhydride, chloromaleic acid anhydride, a-phenylmaleic acid anhydride, succinic acid anhydride, and pyromellitic acid anhydride, or the like as described in the specification of U.S. Pat. No. 4,115,128 can be used. As the phenols, bisphenol A, p-nitrophenol, p-ethoxyphenol, 2,4,4'-trihydroxy benzophenone, 2,3,4-trihydroxy benzophenone, 4-hydroxy benzophenone, 4,4',4"-trihydroxy triphenyl methane, 4,4',31",4"-tetrahydroxy-3,5,3',5'-tetramethyltriphenyl methane, or the like are described. Further, as the organic acids, sulfonic acids, sulfinic acids, alkyl sulfates, phosphonates, phosphate esters, and carboxylic acids as described in Japanese Patent Applications Laid-Open Nos. 60-88942 and 2-96755 are described.

When the cyclic acid anhydride, the phenol or the organic acid is added to a recording layer of a planographic printing plate precursor, the ratio thereof in the recording layer is preferably from 0.05 to 20%, more preferably from 0.1 to 15%, and even more preferably from 0.1 to 10% by mass.

Besides the above-mentioned agents, epoxy compounds, vinyl ethers, and phenol compounds having hydroxymethyl groups as described in Japanese Patent Application Laid- Open No. 8-276558, phenol compounds having alkoxymethyl group and crosslinking compounds having the function of inhibiting dissolution in alkaline solution as described in Japanese Patent Application Laid-Open No. 11-160860 proposed by inventors may be added.

To the photosensitive composition of the invention may be added a printing-out agent for obtaining a visible image immediately after the photosensitive composition of the invention has been heated by exposure to light, or a dye or pigment as an image coloring agent.

A typical example of a printing-out agent is a combination of a compound which is heated by exposure to light, thereby emitting an acid (an optically acid-generating agent), and an organic dye which can form salts (salt formable organic dye).

Specific examples thereof include combinations of an o-naphthoquinonediazide-4-sulfonic acid halogenide with a salt-formable organic dye, described in JP-A Nos. 50-36209 and 53-8128; and combinations of a trihalomethyl compound with a salt-formable organic dye, described in each of JP-A Nos. 53-36223, 54-74728, 60-3626, 61-143748, 61-151644 and 63-58440.

The trihalomethyl compound is classified into an oxazol compound or a triazine compound. Both of the compounds provide excellent in stability over the passage of time and produce a vivid printed-out image.

As the image coloring agent, a dye different from the above-mentioned salt-formable organic dye may be used. Preferable examples of such a dye, and of the salt-formable organic dye, include oil-soluble dyes and basic dyes.

Specific examples thereof include Oil yellow #101, Oil Yellow #103, Oil Pink #312, Oil Green BG, Oil Blue BOS, Oil Blue #603, Oil Black BY, Oil Black BS, and Oil Black T-505 (each of which is manufactured by Orient Chemical Industries Ltd.); Victoria Pure Blue, Crystal Violet (CI42555), Methyl Violet (CI42535), Ethyl Violet, Rhodamine B (CI145170B), Malachite Green (CI42000), and Methylene Blue (CI52015).

Dyes described in JP-A No.62-293247 are particularly preferable. These dyes may be added to the photosensitive composition at a ratio of 0.01 to 10% by mass, and preferably 0.1 to 3% by mass, relative to the total solid contents therein.

Whenever necessary, a plasticizer may be added to the photosensitive composition of the invention to give flexibility to a coating film made from the composition. Examples of the plasticizer include oligomers and polymers of butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl olete, and acrylic acid and methacrylic acid.

[Preparation of a Planographic Printing Plate Precursor]

(Solvent Coat and Coating Method)

A planographic printing plate precursor according to the present invention can be formed by dissolving the constituent components of the recording layer described above into a solvent and coating them onto an appropriate support. Further, a protective layer, a resin intermediate layer, a back coating layer, and the like, which are described later, are provided in the planographic printing plate precursor depending on the purpose and can be formed in the same manner.

The solvents to be used in such cases may be ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene, however the solvents should not be limited to these examples. These solvents may be used alone or in form of mixtures.

The concentration of the above-mentioned components (the solid components including the additives) in the solvent is preferable 1 to 50% by weight.

[Structure of the Recording Layer]

The recording layer of the planographic printing plate precursor of the present invention can use any one of either in a single-layer structure, a phase-separated structure, and a multi-layer structure.

The single-layer type recording layer can use a photosensitive layer described, for example, in Japanese Patent Application Laid-Open No. 7-285275 and pamphlet of International Publication 97/39894; the phase-separated type recording layer can used a photosensitive layer described, for example, in Japanese Patent Application Laid-Open No. 11-44956; and the multi-layer type recording layer can use a photosensitive layer described, for example, in Japanese Patent Application Laid-Open No. 11-218914, U.S. Pat. Nos. 6,352,812B1, 6,352,811B1, 6,358,669B1, and 6,535,238B1, and European Patent No. 864420B1, but are not limited to these examples.

In the case of a multi-layer structure, the essential components (A) to (C) of the present invention are not restricted to the lower layers and the uppermost layer, but can be included in any layer; but in view of the effects, it is preferable to include components (A) to (C) in the lower layer.

Further, although the amount of recording layer coating (solid content) on the support obtained after coating and drying differs depends on the use, it is generally preferable that such amount of film coating (total amount of all layers in the case of multi-layers) after drying is from 0.5 to 5.0 $g/m^2$, and more preferably from 0.6 to 2.0 $g/m^2$.

Various methods can be used to apply the recording layer coating liquid, including, for example, bar-coater coating, rotary coating, spray coating, curtain coating, dip coating, air knife coating, blade coating, roll coating, or the like. Although the apparent sensitivity becomes larger as the amount of coating applied decreases, the special characteristics of the film are rather reduced.

[Support]

The support used in the planographic printing plate precursor of the present invention is a plate having dimensional stability. A plate satisfying required physical properties such as strength and flexibility can be used without any restriction. Examples thereof include paper, plastic (such as polyethylene, polypropylene or polystyrene)-laminated papers, metal plates (such as aluminum, zinc and copper plates), plastic films (such as cellulose biacetate, cellulose triacetate, cellulose propionate, cellulose lactate, cellulose acetate lactate, cellulose nitrate, polyethylene terephthalate, polyethylene, polystyrene, polypropylene, polycarbonate, and polyvinyl acetate films), and papers or plastic films on which, as described above, a metal is laminated or vapor-deposited.

The support is preferably a polyester film or an aluminum plate, and more preferably an aluminum plate, since an aluminum plate is superior in terms of dimensional stability and is also relatively inexpensive.

Preferable examples of the aluminum plate include a pure aluminum plate and alloy plates made of aluminum as a main component with a very small amount of other elements. A plastic film on which aluminum is laminated or vapor-deposited may also be used.

Examples of other elements contained in the aluminum alloys include silicon, iron, manganese, copper, magnesium, chromium, zinc, bismuth, nickel, and titanium. The content by percentage of different elements in the alloy is at most 10% by mass. A particularly preferable aluminum plate in the invention is a pure aluminum plate; however, since from the viewpoint of refining a completely pure aluminum cannot be easily produced, a very small amount of other elements may also be contained in the plate.

The aluminum plate used as the support is not specified in terms of the composition thereof. Thus, aluminum plates which are conventionally known can be appropriately used. The thickness of the aluminum plate used in the invention is from about 0.1 to 0.6 mm, preferably from 0.15 to 0.4 mm, and more preferably from 0.2 to 0.3 mm.

If necessary, prior to the surface-roughening treatment, the aluminum plate may optionally be subjected to degreasing treatment, in order to remove rolling oil or the like on the surface, with a surfactant, an organic solvent, an aqueous alkaline solution or the like.

The surface-roughening treatment of the aluminum surface can be performed by various methods such as a mechanical surface-roughening method, a method of dissolving and roughening the surface electrochemically, and a method of dissolving the surface selectively in a chemical manner.

Mechanical surface-roughening methods which can be used may be known methods, such as a ball polishing method, a brush polishing method, a blast polishing method or a buff polishing method. An electrochemical surface-roughening method may be a method of performing surface-roughening in an electrolyte of hydrochloric acid or nitric acid, by use of an alternating current or a direct current. As disclosed in JP-A No. 54-63902, a combination of the two kinds of methods may be used.

An aluminum plate whose surface is roughened as described above is if necessary subjected to alkali-etching treatment and neutralizing treatment. Thereafter, an anodizing treatment is optionally applied in order to improve the water holding capacity and wear resistance of the surface.

The electrolyte used in the anodizing treatment of the aluminum plate is any one selected from various electrolytes which can form a porous oxide film. Among which in general use are electrolytes of sulfuric acid, phosphoric acid, oxalic acid, chromic acid, or a mixed acid thereof. The concentration of the electrolyte may be appropriately decided depending on the kind of electrolyte selected.

Treatment conditions for anodization cannot be specified as a general rule since conditions vary depending on the electrolyte used; however, the following range of conditions are generally suitable: an electrolyte concentration of 1 to 80% by mass, a solution temperature of 5 to 70° C., a current density of 5 to 60 $A/dm^2$, a voltage of 1 to 100 V, and an electrolyzing time of 10 seconds to 5 minutes. If the amount of anodic oxide film is less than 1.0 $g/m^2$, printing resistance is inadequate or non-image portions of the planographic printing plate tend to become easily damaged and the so-called "blemish stains", resulting from ink adhering to damaged portions at the time of printing, are easily generated.

After the anodizing treatment, the surface of the aluminum is if necessary subjected to treatment for obtaining hydrophilicity. This securance of hydrophilicity treatment may be an alkali metal silicate (for example, an aqueous sodium silicate solution) method, as disclosed in U.S. Pat. Nos. 2,714,066, 3,181,461, 3,280,734, and 3,902,734. In this method, the support is subjected to an immersing treatment or an electrolyzing treatment with an aqueous sodium silicate solution.

In addition, the following methods may also be used: a method of treating the support with potassium fluorozirconate, as disclosed in JP-B No. 36-22063, or with polyvinyl phosphonic acid, as disclosed in U.S. Pat. Nos. 3,276,868, 4,153,461, and 4,689,272.

(Undercoat Layer)

In the planographic printing plate precursor of the present invention, although a recording layer is provided on the support, an undercoat layer can be disposed, when required, between the support and the recording layer (lower layer). The provision of the undercoat layer offers the benefit that: the undercoat layer functions as a heat-insulating layer between the support and the lower layer so that the heat generated by the exposure of the infrared laser does not diffuse into the support, thus providing higher sensitivity due to the efficient use of the heat. Further, when this undercoat layer is provided in the recording layer according to the present invention, the recording layer is situated still at the exposure surface or near thereat and thus the sensitivity to the infrared laser can be favorably maintained.

In the unexposed areas, it is assumed that, since the recording layer itself is impervious to the alkaline developer and functions as a protective layer for the undercoat layer, the stability of image development is improved while images of excellent discrimination are formed and the stability over time can be ensured.

In the exposed areas, the components of the recording layer which have been released from the solubility suppressing effect are rapidly dissolved and dispersed in the developer. Further, the undercoat layer itself, which exists adjacent to the support, is an alkaline soluble polymer having favorable solubility in the developer, and thus is rapidly dissolved without generating a residual film even if a developer with lowered activity is used, contributing the improvement of the developability. That is, the undercoat layer is useful.

As components of the undercoat layer, various organic compounds can be used. Examples thereof include carboxymethylcellulose, dextrin, gum arabic, phosphonic acids having an amino group, such as 2-aminoethylphosphonic acid, organic phosphonic acids which may have a substituent, such as phenyl phosphonic acid, naphthylphosphonic acid, alkylphosphonic acid, glycerophosphonic acid, methylenediphosphonic acid and ethylenediphosphonic acid, organic phosphoric acids which may have a substituent, such as phenylphosphoric acid, naphthylphosphoric acid, alkylphosphoric acid and glycerophosphoric acid, organic phosphinic acids which may have a substituent, such as phenylphosphinic acid, naphthylphosphinic acid, alkylphosphinic acid and glycerophosphinic acid, amino acids such as glycine and β-alanine, and hydrochlorides of amines having a hydroxyl group, such as a hydrochloride of triethanolamine. These organic compounds may be used alone or in the form of a mixture made up of two or more thereof.

The appropriate coated amount of undercoat layer is from 2 to 200 $mg/m^2$, and preferably from 5 to 100 $mg/m^2$. When the coating amount is less than 2 $mg/m^2$, sufficient printing endurance cannot be obtained. The same applies when the coating amount is more than 200 $mg/M^2$.

The planographic printing plate precursor of the present invention has images formed by heat. Specifically, direct imagewise recording by a thermal recording head or the like, scan-exposure by infrared laser, high-luminosity flash exposure by a xenone discharge lamp or the like, infrared lamp exposure, or the like are employed. Exposure by a solid high-output infrared laser such as a semiconductor laser which emits infrared beams, a YAG laser, and the like having a wavelength of 700 to 1200 nm is preferable.

A laser output of 100 mW or more is preferable, and use of a multi-beam laser device is preferable for shortening the exposure time. Further, the exposure time per 1 pixel is preferably 20 μsec or less, and the energy irradiated onto the recording material is preferably from 10 to 500 $mG/cm^2$.

The developer which can be used in developing treatment of the first and second planographic printing plate precursors of the invention is a developer having a pH of 9.0 to 14.0, preferably 12.0 to 13.5. The developer, the category of which includes not only developer but also replenisher hereinafter, may be an aqueous alkaline solution that has been known so far. Examples thereof include aqueous solutions of inorganic alkali salts such as sodium silicate, potassium silicate, sodium triphosphate, potassium triphosphate, ammonium triphosphate, sodium biphosphate, potassium biphosphate, ammonium biphosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, ethyleneimine, ethylenediamine, and pyridine. These aqueous alkaline soltuions may be used alone or in combination of two or more thereof.

Of the above-mentioned aqueous alkaline solutions, one preferable developer, which exhibits the effects of the invention effectively, is an aqueous solution having a pH of 12 or more and comprising alkali silicate as a base or alkali silicate obtained by mixing a base with a silicon compound. The aqueous solution is the so-called "silicate developer". Another preferable developer is the so-called "non-silicate developer", which does not comprise any alkali silicate but comprises a nonreducing sugar (organic compound having a buffer effect) and a base.

About the former, the developing power of aqueous solution of alkali metal silicate can be adjusted by adjusting the ratio between silicon oxide $SiO_2$ and alkali metal oxide $M_2O$, which are components of the silicate, (generally, the mole ratio of $[SiO_2]/[M_2O]$), and the concentration of the alkali metal silicate. For example, the following is preferably used: an aqueous solution of sodium silicate wherein the mole ratio of $SiO_2/Na_2O$ ($[SiO_2[/[Na_2O]]$ is from 1.0 to 1.5 and the content by percentage of $SiO_2$ is from 1 to 4% by mass, as disclosed in JP-A No. 54-62004; or an aqueous solution of alkali metal silicate wherein the mole ratio of $SiO_2/M$ is from 0.5 to 0.75 (that is, the mole ratio of $SiO_2/M_2O$ is from 1.0 to 1.5), the content by percentage of $SiO_2$ is from 1 to 4% by mass, and the content by percentage of potassium in all alkali metals is 20% by gram atom, as disclosed in JP-B No. 57-7427.

The so-called "non-silicate developer", which does not comprise any alkali silicate but comprises a nonreducing sugar and a base, is also preferable for being used to develop the first and second planographic printing plate precursors of the invention. When this developer is used to develop any one of the planographic printing plate precursors, ink-adsorbing power of the recording layer can be kept better without deteriorating the surface of the recording layer.

Further, although a planographic printing plate material generally has a narrow development latitude and experiences a large change in scanning width and the like depending on the pH value of the developer, since a non-silicate developer contains a non-reducing sugar having a buffering property to suppress the pH fluctuation, use of a non-silicate developer is advantageous, as compared with using a developing liquid containing a silicate. Further, since a non-reducing sugar is unlikely to contaminate a conductivity sensor, a pH sensor, or the like which control the liquid activity, as compared with a silicate, a non-silicate developer is more advantageous than a silicate developer in this regard, as well. Further, the discrimination-improving effect of a non-silicate developer is remarkable in the planographic printing plate material of the present invention. It is assumed that such a good discrimination-improving effect is obtained because contact with the developer (permeation), which is an important aspect in the present invention, is made moderate and the difference between the exposed areas and the non-exposed areas can be expressed more easily.

The aforementioned non-reducing sugar belongs to sugars which do not have free aldehyde groups or ketone groups and show a non-reducing property; these sugars are classified into trehalose-type oligo-saccharides in which reducing groups are bonded to each other, glucosides in which reducing group of sugars and non-sugar material are bonded, and sugar alcohols formed by reducing sugars with hydrogenation, each of which can be used suitably in the present invention. In the present invention, non-reducing sugars described in Japanese Patent Application Laid-Open No. 8-305039 can be used suitably.

Examples of the trehalose type oligosaccharides include saccharose and trehalose. Examples of the glucosides include alkylglucosides, phenolglucosides, and mustard seed oil glucoside. Examples of the sugar alcohols include D, L-arabite, ribitol, xylitol, D, L-sorbitos, D, L-mannitol, D, L-iditol, D, L-talitol, dulcitol, and allodulcitol. Furthermore, maltitol, obtained by hydrogenating a disaccharide, and a reductant obtained by hydrogenating an oligosaccharide (i.e., reduced starch syrup) are preferable. Of these examples, sugar alcohol and saccharose are more preferable. D-sorbitol, saccharose, and reduced starch syrup are even more preferable since they have buffer effect within an appropriate pH range and are inexpensive.

These non-reducing sugars may be used alone or two or more may be used in combination. The content of the non-reducing sugar in the non-silicate developer is preferably from 0.1 to 30 mass % and, more preferably, from 1 to 20 mass %. When the content is less than 0.1 mass %, a sufficient buffering effect may not be obtained. When the content exceeds 30 mass %, making high concentrations may become difficult, resulting in higher cost of the materials.

The base combined with the nonreducing sugar(s) may be an alkali agent that has been known so far. Examples thereof include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

The bases may be used each alone or two or more may be used in combination. Among the bases, sodium hydroxide or potassium hydroxide is preferred. In the present invention, instead of the combined use of the non-reducing sugar and the base, it is possible to use a non-silicate developer whose main component is an alkaline metal salt of a non-reducing sugar.

Further, an alkaline buffer solution comprising a weak acid and a strong base other than the non-reducing sugar can be used in combination as the non-silicate developer. As the weak acid, those having a dissociation constant (pKa) of 10.0 to 13.2 are preferred, and can be selected from among those described, for example, in “Ionization Constants of Organic Acids in Aqueous Solution” published by Pergamon Press, or the like.

With an aim of promoting or suppressing image development, dispersing development scum, or improving the ink-affinity of the printing plate image area, various surfactants or organic solvents can be added to the developer and a replenisher as required. As the surfactant, anionic, cationic, nonionic, and amphoteric surfactants are preferred. Further, as the organic solvent, reducing agents such as hydroquinone, resorcin, and sodium salts or potassium salts of inorganic acids such as sulfurous acid or hydrogen sulfurous acid, and further, organic carboxylic acids, defoamers, softening agents for hard water, can be added to the developer and the replenisher.

The planographic printing plate developed using the developer and the replenisher described above is post-treated with washing water, a rinsing solution containing a surfactant or the like, and a desensitizing solution containing gum arabic or starch derivative. Various combinations of these can be used for the post-treatment.

In the case of carrying out development by using an automatic developing apparatus, it is known that a large quantity of PS plates can be treated without replacing the developer in a developer tank for a long duration by adding, to the developer, aqueous solution (a replenisher) with a higher alkalinity than that of the developer. In the invention, this replenishing method is preferably employed. To promote or suppress the developability of the developer or the replenisher and improve the dispersion of development scum and affinity of the image forming portion of the printing plate to ink, a variety of surfactants and organic solvents may optionally be added.

As preferable surfactants, anionic, cationic, nonionic and amphoteric surfactants can be exemplified. Further, to the developer or the replenisher, reducing agents of such as hydroquinone, resorcin, sodium salt or potassium salt of inorganic acids such as sulfurous acid, hydrogen sulfurous acid, and further organic carboxylic acid, defoaming agents, and water hardening or softening agents may be added.

The printing plate treated by using the developer or the replenisher is washed with water and post-treated with rinsing solutions containing the surfactants or the like, and desensitizing solutions containing gum arabic and starch derivatives. The post-treatment of the image recording material of the invention can be carried out by using these treatments in combinations.

Recently, for rationalization or standardization of the printing plate production work in printing plate-producing or printing industries, automatic developing apparatuses for printing plates have been used widely. An automatic developing apparatuses generally comprise a development section and a post-treatment section. More specifically, an automatic developing apparatus includes a unit for transferring the printing plates, tanks for respective treatment solutions, and a spraying apparatuse The automatic developing apparatus transfers the exposed printing plates horizontally and at the same time carries out development treatment by spraying the respective treatment solutions pumped up by pumps, to the printing plate, through spray nozzles. Recently, there is also known a method for carrying out treatment by transporting the printing plates by under-solution guide rolls while the printing plates are immersed in the treatment solution tanks filled with the treatment solutions. In such automatic treatment, the replenishers may be replenished to the respective treatment solutions depending on the treatment quantity, operation times, and the like. Alternatively, so-called disposable treatment method in which treatment is carried out using substantially unused treatment solutions can be employed.

In the planographic printing plate precursor of the present invention, the planographic printing plate percursor is imagewise exposed, developed, washed with water and/or rinsed and/or gum-coated to obtain a planographic printing plate. If unnecessary image portions (e.g. film edge trace of a master film) are present in the planographic printing plate, the unnecessary image portions are erased. Such erasing is preferably carried out by a method of applying an erasing solution as described in JP-B No. 2-13293 to the unnecessary image portions and washing with water after a prescribed duration. A method of radiating active light beam led through optical fibers to the unnecessary image portions and then carrying out development may also be employed.

The planographic printing plate produced in such a manner is coated with a desensitizing gum if necessary and supplied to printing steps. In a case where a planographic printing plate with further improved printing durability is to be obtained, baking treatment is optionally carried out.

In the case where the baking treatment of the planographic printing plate is carried out, it is preferable to treat, prior to the baking treatment, the planographic printing plate with surface conditioning solutions described in JP-B Nos. 61-2518 and 55-28062 and JP-A Nos. 62-31859 and 61-159655.

Examples of a method for effecting such a pre-baking treatment include a method of applying the surface conditioning solutions to the planographic printing plate by sponge or degreased cotton doped with the solutions, a method of immersing the printing plate in a vat filled with the surface conditioning solutions, a method of applying the surface conditioning solutions using automatic coaters. In a case where after application the amount of solution applied is made uniform with a squeegee or a squeegee roller, a better result can be obtained.

In general, the amount of surface-adjusting solution applied is suitably from 0.03 to 0.8 $g/m^2$ (dry mass). If necessary the planographic printing plate onto which the surface-adjusting solution is applied can be dried, and then the plate is heated to a high temperature by means of a baking processor (for example, a baking processor (BP-1300) sold by Fuji Photo Film Co., Ltd.) or the like. In this case, the heating temperature and the heating time, which depend on the kind of components forming the image, are preferably from 180 to 300° C. and from 1 to 20 minutes, respectively.

If necessary, a planographic printing plate subjected to a baking treatment can be subjected to treatments which have been conventionally conducted, such as a water-washing treatment and gum coating. However, in a case where a surface-adjusting solution containing a water soluble polymer compound or the like is used, the so-called desensitizing treatment (for example, gum coating) can be omitted.

The planographic printing plate precursor of the present invention is processed into a planographic printing plate. This planographic printing plate is then placed on an offset printing machine and the like, and used for printing large quantities of sheets. The planographic printing plate precursor of the present invention has the advantages of excellent chemical resistance and printing endurance in the image area, wide image development latitude, and excellent image reproducibility.

EXAMPLE

The present invention will be explained in conjunction with examples, but the invention is not restricted to such examples.

Synthesis Example 1

Synthesis of Specified Maleimide Polymer 1: N-(p-phenylsulfoneamide)-substituted (methylvinyl ether/maleimide) copolymer 20 mass % solution of anhydrous n-methyl pyrrolidone (NMP) (156 g) of Gantrez AN 119 (trade name, linear methylvinyl ether/maleic acid anhydride copolymer having a molecular weight of 190,000, manufactured by ISP Co. in U.S.A) was placed in a beaker and dissolved with anhydrous NMP (300 g). After dissolution, p-aminobenzene sulfoneamide (hereinafter referred to as "sulfanilamide" where appropriate) (34.46 g) was added, and dissolved while stirring. Then, dimethylaminopyridine (0.2 g) was added. After stirring for 45 minutes at room temperature, the mixture was immersed in a hot bath and heated at 90 to 95° C. over 1 hour. The mixture was cooled and left to stand for one night.

2 liters of distilled water containing 10 ml of concentrated hydrochloric acid was placed in a 3 liter beaker and stirred thoroughly. When the resulting reaction mixture was poured extremely slowly in a thin flow into a beaker while continuously stirring, the desired product (specified maleimide polymer 1 having the following structure) was formed, and precipitated as a yellowish brown-pink liquid suspension. The mixture was stirred for 2 hours and then precipitated. The precipitates were filtered and further suspended again in 2 liters of water for 2 hours, filtered, and dried in a blower oven for one night to obtain a dark brown granules (48.4 g, yield: 78.0%).

FTIR analysis of the obtained specified maleimide polymer 1 shows the presence of an imide C—N—C extension which shows the presence of a cyclic imide. An extremely weak peak also implies the presence of an N—H group of an amide group which shows the presence of a trace amount of a hydrolyzed or unclosed ring product.

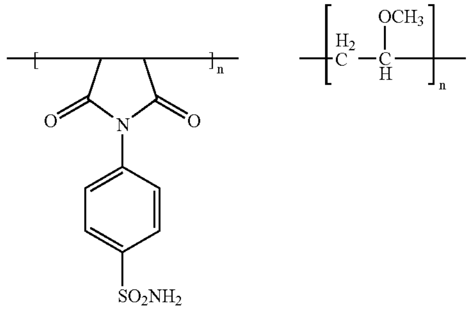

Specified maleimide polymers 2 to 10 can also be prepared from the reagents to be described below following substantially the same procedures as described in Synthesis Example 1. While the specified polymers 1 and 2 are prepared using a basic catalyst reaction, specified polymers 3 to 10 are obtained using an acid catalyst reaction.

Synthesis Example 2

Synthesis of Specified Maleimide Polymer 2: N-(p-hydroxyphenyl)-substituted (methylvinyl ether/maleimide) copolymer, Yield: 84.7%

Reagents used:
- GantrezAN119 (39.03 g: 0.25 mol)
- p-aminophenol (27.3 g: 0.25 mol)
- n-methylpyrrolidone (300 g: 3.02 mol)
- dimethylaminopyridine (0.4 g)

Synthesis Example 3

Synthesis of Specified Maleimide Polymer 3: N-(p-phenylsulfoneamide)-substituted (styrene/maleimide (1:1)) copolymer, Yield: 90.3%

Reagents used:
- styrene/maleic acid anhydride (1:1) copolymer (11.67 g: 0.05 mol)
- Sulfanylamide (8.62g: 0.05 mol)
- n-methylpyrrolidone (24.8g: 0.25 mol)
- (glacial)acetic acid (30.03 g: 0.5 mol)

Synthesis Example 4

Synthesis of Specified Maleimide Polymer 4: N-(p-phenylsulfoneamide)-substituted (styrene/maleimide (2:1))copolymer, Yield: 93.2%

Reagents used:
- styrene/maleic acid anhydride (2:1)copolymer (15.32 g: 0.05 mol)
- sulfanylamide (8.62 g: 0.05 mol)
- n-methylpyrrolidone (24.8 g: 0.25 mol)
- (glacial) acetic acid (30.03 g: 0.5 mol)

Synthesis Example 5

Synthesis of Specified Maleimide Polymer 5: N-(p-phenylsulfoneamide)-substituted (styrene/maleimide(3:1))copolymer, Yield: 95.2%

Reagents used:
- styrene/maleic acid anhydride (3:1)copolymer (19.74 g: 0.05 mol)
- sulfanilamide (8.62 g: 0.05 mol)
- n-methylpyrrolidone (24.8 g: 0.25 mol)
- (glacial) acetic acid (30.03 g: 0.5 mol)

Synthesis Example 6

Synthesis of Specified Maleimide Polymer 6: N-(p-sulfoneamide)-substituted (methylvinylether/maleimide) copolymer: Yield: 67.7%

Reagents used:
- Gantrez AN119 (15.61 g: 0.1 mol)
- sulfanilamide (17.23 g: 0.1 mol)

n-methylpyrrolidone (46.8 g: 0.47 mol)
(glacial)acetic acid (46.83 g: 0.75 mol)

Synthesis Example 7

Synthesis of Specified Maleimide Polymer 7: N-(p-aminophenol)-substituted (methylvinylether/maleimide) copolymer, Yield: 67.7%

Reagents used:
- Gantrez AN119 (15.61 g: 0.1 mol)
- p-aminophenol (10.92 g: 0.1 mol)
- n-methylpyrrolidone (46.8 g: 0.47 mol)
- (glacial)acetic acid (46.83 g: 0.75 mol)

Synthesis Example 8

Synthesis of Specified Maleimide Polymer 8: Mixed N-(p-sulfoneamide) and N-cyclohexyl-substituted (50:50) (methylvinyl ether/maleimide)copolymer, Yield: 75.2%

Reagents used:
- Gantrez AN 119 (15.61 g: 0.1 mol)
- sulfanylamide (8.62 g: 0.05 mol)
- cyclohexylamine (4.91 g: 0.05 mol)
- n-methylpyrrolidone (46.8 g: 0.47 mol)
- (glacial)acetic acid (46.83 g: 0.75 mol)

Synthesis Example 9

Specified Maleimide Polymer 9: Synthesis of Mixed Sulfoneamide and N-cyclohexyl-substituted (25:75) (methylvinyl ether/maleimide)copolymer, Yield: 75.7%

Reagents used:
- GantrezAN119 (15.61 g: 0.1 mol)
- sulfanylamide (4.31 g: 0.03 mol)
- cyclohexylamine (7.37 g: 0.08 mol)
- n-methylpyrrolidone (46.8 g: 0.47 mol)
- (glacial)acetic acid (46.83 g: 0.75 mol)

Synthesis Example 10

Specified Maleimide Polymer 10: Synthesis of Mixed N-(p-sulfoneamide) and N-cyclohexyl-substituted (37.5:62.5) (methylvinyl ether/maleimide)copolymer, Yield: 75.4%

Reagents used:
- GantrezAN119 (15.61 g: 0.1 mol)
- sulfanylamide (6.46 g: 0.04 mol)
- cyclohexylamine (6.14 g: 0.06 mol)
- n-methylpyrrolidone (46.8 g: 0.47 mol)
- (glacial)acetic acid (46.83 g: 0.75 mol)

The following Table 1 shows the structures of the specified maleimide polymers 1 to 10 synthesized as described above.

TABLE 1

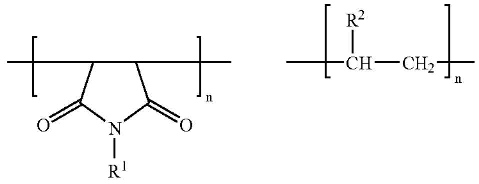

| Compound No. | $R^1$ | $R^2$ |
|---|---|---|
| 1 | para($H_2NSO_2$)-phenyl— | —$OCH_3$ |
| 2 | para-hydroxyphenyl- | —$OCH_3$ |
| 3 | para-($H_2NSO_2$)-phenyl- | -phenyl |
| 4 | para-($H_2NSO_2$)-phenyl- | -phenyl |
| 5 | para-($H_2NSO_2$)-phenyl- | -phenyl |
| 6 | para-($H_2NSO_2$)-phenyl- | —$OCH_3$ |
| 7 | para-hydroxyphenyl- | —$OCH_3$ |
| 8 | para-($H_2NSO_2$)-phenyl-and cyclohexyl-(50:50) | —$OCH_3$ |
| 9 | para-($H_2NSO_2$)-phenyl-and cyclohexyl-(25:75) | —$OCH_3$ |
| 10 | para-($H_2NSO_2$)-phenyl-and cyclohexyl-(37.5:62.5) | —$OCH_3$ |

Examples 1 to 12, Comparative Examples 1 to 10

[Preparation of a Support]

An aluminum sheet having a thickness of 0.3 mm (material: JIS A 1050) was subjected to a 10 sec. etching treatment in a liquid having an NaOH concentration of 30 g/l, an aluminum ion concentration of 10 g/l, and a liquid temperature of 60° C.; then washed with running water, neutralized and washed with 10 g/l nitric acid, and washed with water. The treated sheet was then subjected to an electrochemical roughening treatment having an electrical quantity of 400C/$dm^2$ using a sinusoidal AC waveform current at an applied voltage of Va=20V in an aqueous solution having an HCl concentration of 15 g/l, an aluminum ion concentration of 10 g/l, and a liquid temperature of 30° C.; and then washed with water. Next, an 10 sec. etching treatment was conducted in a liquid having an NaOH concentration of 30 g/l, an aluminum ion concentration of 10 g/l, and a liquid temperature of 40° C.; then the treated sheet was washed with running water. Then, the sheet was subjected to desmutting treatment in an aqueous sulfuric acid solution having a sulfuric acid concentration of 15 mass % and a liquid temperature of 30° C., and washed with water. Further, the sheet was subjected to an anodizing treatment in an aqueous sulfuric acid solution of 10 mass % at a liquid temperature of 20° C. at a DC current density of 6A/$dm^2$ so that the amount of anodized film corresponded to 2.5 g/$m^2$, then the sheet was washed with water and dried. Lastly, the sheet was treated with an aqueous sodium silicate solution of 1.0 mass % at 30° C. for 10 sec. to obtain a hydrophilated support (a).

When the average surface roughness across a center line of the support (a) was measured using a 2 μm diameter needle, this roughness was 0.43 μm.

[Formation of an Undercoat Layer]

The support (a) thus obtained was coated with the undercoat solution described below, dried at 80° C. for 30 sec. to provide an undercoat layer. The amount of undercoat layer after drying was 17 mg/$m^2$.

| (Composition of the undercoat layer) | |
|---|---|
| compound described below | 0.3 g |
| methanol | 100 g |
| water | 1 g |

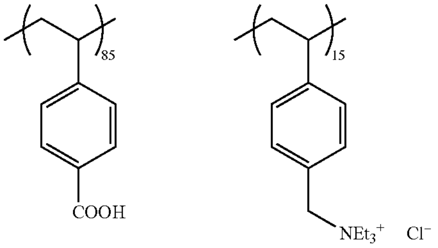

weight-average molecular weight: 28,000

[Formation of a Recording Layer]

The support having an undercoat layer thus obtained was coated with the positive recording layer coating solution described below, dried in an oven at 150° C. for 1 min. to obtain a positive photosensitive planographic printing plate having a positive recording layer having a dried coating amount of 1.5 g/m2.

| [Coating solution 1 for a positive recording layer] | |
|---|---|
| novolac resin A (m/p-cresol(6/4), weight average molecular weight: 7,000, unreacted cresol : 0.5 mass %) | 0.15 g |
| (A) specified maleimide polymer (compound as described in Table 2 below) | 0.80 g |
| (B) cyanine dye A (structure as described below) | 0.07 g |
| (C) specified amino compound (compound as described in Table 2 below) | 0.05 g |
| tetrahydrophthalic acid anhydride | 0.04 g |
| ethyl violet | 0.02 g |
| fluoropolymer (Defenser F-780F (solid content: 30%), manufactured by Dainippon Ink and Chemicals Ltd. | 0.015 g |
| methyl ethyl ketone | 12 g |

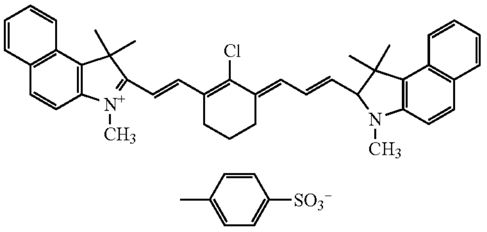

Cyanine dye A

The structures of the specified maleimide polymers 1 to 10 in the present invention as listed in the following Table 2 are described in the synthesis examples described above.

[Evaluation of Printing Endurance and Chemical Resistance]

The photosensitive planographic printing plate precursor thus obtained had a picture-shaped test pattern drawn onto it using a Trendsetter manufactured by Creo Co., Ltd. using a beam intensity of 9W and a drum rotational speed of 150 rpm.

Then, image development was performed using a PS processor 900H manufactured by Fuji Photo Film Co., Ltd. in which an alkaline developer having the following composition was stocked, the development time being 20 sec. while maintaining the liquid temperature at 30° C. The resulting planographic printing plate was used for printing by a Lithoron Printing Press manufactured by Komori Corp. using sumi ink DIC-GEOS(N) manufactured by Dainippon Ink and Chemicals Ltd., and the printing endurance was evaluated by the number of sheets printed until it was confirmed by visual observation that the density of the solid image began to get thinner. These results are shown in Table 2.

With the addition of a step of wiping the plate surface with a cleaner (multi-cleaner manufactured by Fuji Photo film Co., Ltd.) after every 5000 sheets printed, the printing endurance was evaluated in the same manner as above. The prior printing endurance is referred to as "ordinary printing endurance", and the latter printing endurance is referred to as "cleaner printing endurance", both results are shown in Table 1. As the cleaner printing endurance becomes higher, the chemical resistance is evaluated as "good". These results are shown in Table 2.

| <Composition of the alkaline developer> | |
|---|---|
| $SiO_2.K_2O$ ($K_2O/SiO_2$ = 1/1 (molar ratio)) | 4.0 mass % |
| citric acid | 0.5 mass % |
| polyethylene glycol lauryl ether (weight-average molecular weight; 1000) | 0.5 mass % |
| water | 95.0 mass % |

[Evaluation of Image Development Latitude]

The light sensitive planographic printing plate precursor thus obtained was subjected to exposure to light and image development in the same manner as in the evaluation for printing endurance and the chemical resistance. Then, while adding a suitable amount of aqueous potassium hydroxide solution of 3 mass % to an alkaline developer to increase the electroconductivity of the developer by each predetermined value, image development was performed using developers at each electroconductive value. While blowing gaseous carbon dioxide into the alkaline developer to decrease the electroconductivity of the developer by each predetermined value to prepare several kinds of developers of low electroconductive values (namely, developers with low activity), image development was performed using each kind of developer. In the image development of these developers, the difference between the developer having highest electroconductivity, in which good image development occurred with no leaching in the image area and no stains or discolorations in the non-image area caused by improperly developed residual film of the photosensitive layer, and the developer having the lowest electroconductivity became the index for development latitude. It was evaluated that development latitude is better as the difference in electroconductivity becomes larger. These results are shown in Table 2.

TABLE 2

| | (A) Specified maleimide polymer | (C) Specified amino compound | Ordinary printing resistance (unit: 10000) | Cleaner printing resistance (unit: 10000) | Development latitude (ms/cm) |
|---|---|---|---|---|---|
| Example 1 | 1 | C-1 | 13 | 11 | 10 |
| Example 2 | 2 | C-6 | 12 | 10 | 9 |
| Example 3 | 3 | C-5 | 11 | 9 | 10 |
| Example 4 | 4 | C-20 | 12 | 10 | 10 |
| Example 5 | 5 | C-11 | 13 | 11 | 9 |
| Example 6 | 6 | C-1 | 12 | 10 | 10 |
| Example 7 | 7 | C-6 | 11 | 9 | 10 |

TABLE 2-continued

| | (A) Specified maleimide polymer | (C) Specified amino compound | Ordinary printing resistance (unit: 10000) | Cleaner printing resistance (unit: 10000) | Development latitude (ms/cm) |
|---|---|---|---|---|---|
| Example 8 | 8 | C-1 | 12 | 10 | 9 |
| Example 9 | 9 | C-1 | 11 | 9 | 9 |
| Example 10 | 10 | C-6 | 13 | 11 | 9 |
| Example 11 | 8 | C-5 | 12 | 10 | 10 |
| Example 12 | 8 | C-11 | 12 | 10 | 9 |
| Comp. Example 1 | 1 | None | 11 | 6 | 4 |
| Comp. Example 2 | 2 | None | 10 | 5 | 4 |
| Comp. Example 3 | 3 | None | 9 | 5 | 3 |
| Comp. Example 4 | 4 | None | 10 | 5 | 3 |
| Comp. Example 5 | 5 | None | 11 | 6 | 4 |
| Comp. Example 6 | 6 | None | 10 | 5 | 3 |
| Comp. Example 7 | 7 | None | 9 | 4 | 4 |
| Comp. Example 8 | 8 | None | 10 | 6 | 4 |
| Comp. Example 9 | 9 | None | 9 | 5 | 3 |
| Comp. Example 10 | 10 | None | 11 | 6 | 3 |

As apparent from Table 2, Examples 1 to 12 (the planographic printing plate precursors of the present invention) are particularly excellent in cleaner printing endurance or in chemical resistance. On the other hand, it can be seen that the planographic printing plate precursors in Comparative Examples 1 to 10, which do not contain the specified amino compounds which are the additives of the present invention, have weak chemical resistance despite the use of specified maleimide polymers.

In addition, it can be seen that Examples 1 to 12 (the planographic printing plate precursors of the present invention) also have excellent development latitude in comparison to Comparative Examples 1 to 11.

What is claimed is:

1. A planographic printing plate precursor comprising:

a support; and a positive recording layer formed on the support, the positive recording layer including: (A) a polymer having a structural unit represented by the following general formula (1), (B) a photo-thermal converting agent, and (C) an amino compound having a methylol group or an alkoxymethyl group, wherein the solubility of the positive recording layer in an alkaline developer is improved by exposure to light or by heating:

General formula (1)

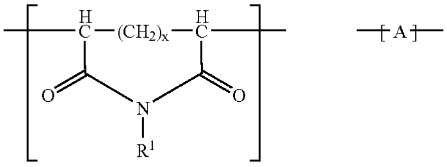

wherein in general formula (1), $R^1$ represents an alkyl group or a cyclic group, x represents 0 or 1, and A in general formula (1) is selected from the group consisting of an alkylene group, a connection group represented by the following general formula (2), and a connection group represented by the following general formula (3):

General formula (2)

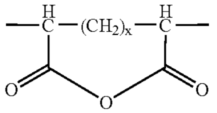

General formula (3)

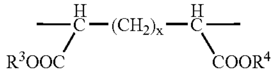

wherein in general formula (2) and general formula (3), x each independently represents 0 or 1, and, in general formula (3), $R^3$ and $R^4$ each independently represents a hydrogen atom or an alkyl group.

2. The planographic printing plate precursor according to claim 1, wherein A in general formula (1) is an alkylene group.

3. The planographic printing plate precursor according to claim 1, wherein the polymer having a structural unit represented by general formula (1) contains the structural unit represented by general formula (1) in an amount of 5 mass % or more.

4. The planographic printing plate precursor according to claim 1, wherein the polymer having a structural unit represented by general formula (1) has a weight average molecular weight of from 1,000 to 500,000.

5. The planographic printing plate precursor according to claim 1, wherein the amino compound has at least two substituents selected from the group consisting of a methylol group and an alkoxymethyl group.

6. The planographic printing plate precursor according to claim 5, wherein the amino compound (C) includes a structure represented by the following general formula (I):

General formula (I)

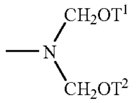

wherein in general formula (I), $T^1$ and $T^2$ each independently represents a hydrogen atom, an alkyl group, an alkenyl group, an acyl group, or an acetyl group.

7. The planographic printing plate precursor according to claim 6, wherein when $T^1$ and $T^2$ in general formula (I) are alkyl groups, the alkyl groups have from 1 to 8 carbon atoms.

8. The planographic printing plate precursor according to claim 6, wherein the amino compound is an amino compound represented by the following general formula (II):

General formula (II)

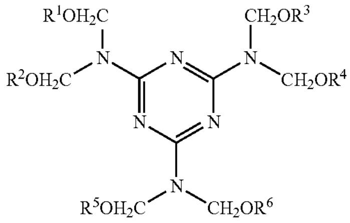

wherein in general formula (II), $R^1$ to $R^6$ each independently represents a hydrogen atom, an alkyl group, an alkenyl group, an acyl group, or an acetyl group.

9. The planographic printing plate precursor according to claim 1, wherein (B) the photo-thermal converting agent is an infrared light absorbent which has a light absorption region in an infrared region of 750 to 1200 nm.

10. The planographic printing plate precursor according to claim 1, wherein the positive recording layer further comprises a cyclic acid anhydride as an additive.

11. A planographic printing plate precursor comprising:

a support; and a positive recording layer formed on the support, the positive recording layer including: (A) a polymer having a structural unit represented by the following general formula (1), (B) a photo-thermal converting agent, and (C) an amino compound, wherein the solubility of the positive recording layer in an alkaline developer is improved by exposure to light or by heating:

General formula (1)

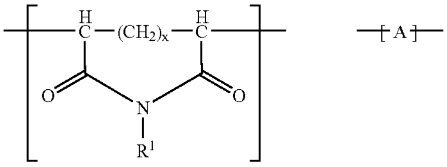

wherein in general formula (1), $R^1$ represents an alkyl group or a cyclic group, x represents 0 or 1, and A represents a bivalent bonding group, wherein the amino compound (C) includes a structure represented by the following general formula (I):

General formula (I)

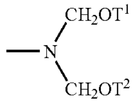

wherein in general formula (I), $T^1$ and $T^2$ each independently represents an alkenyl group having from 2 to 18 carbon atoms.

12. A planographic printing plate precursor comprising:

a support; and a positive recording layer formed on the support, the positive recording layer including: (A) a polymer having a structural unit represented by the following general formula (1), (B) a photo-thermal converting agent, and (C) an amino compound, wherein the solubility of the positive recording layer in an alkaline developer is improved by exposure to light or by heating:

General formula (1)

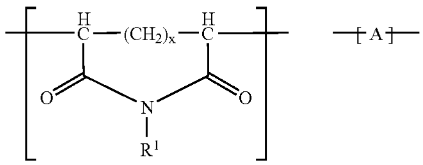

wherein in general formula (1), $R^1$ represents an alkyl group or a cyclic group, x represents 0 or 1, and A represents a bivalent bonding group, wherein the amino compound (C) includes a structure represented by the following general formula (I):

General formula (I)

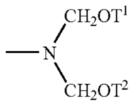

wherein in general formula (I), $T^1$ and $T^2$ each independently represents an acyl group having from 2 to 18 carbon atoms.

13. A planographic printing plate precursor comprising:

a support; and a positive recording layer formed on the support, wherein the positive recording layer comprises a polymer having a structural unit represented by the following general formula (1), and an amino compound having at least two substituents selected from the group consisting of a methylol group and an alkoxymethyl group, and the solubility of the positive recording layer in an alkaline developer is improved by exposure to light or by heating:

General formula (1)

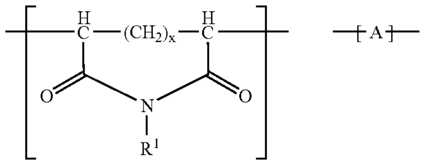

wherein in general formula (1), $R^1$ represents an alkyl group or a cyclic group, x represents 0 or 1, and A in general formula (1) is selected from the group consisting of an alkylene group, a connection group represented by the following general formula (2), and a connection group represented by the following general formula (3):

General formula (2)

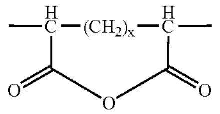

-continued

General formula (3)

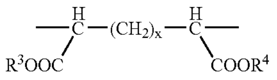

wherein in general formula (2) and general formula (3), x each independently represents 0 or 1, and, in general formula (3), $R^3$ and $R^4$ each independently represents a hydrogen atom or an alkyl group.

14. The planographic printing plate precursor according to claim 13, wherein the positive recording layer further includes a photo-thermal converting agent.

15. The planographic printing plate precursor according to claim 13, wherein A in general formula (1) is an alkylene group.

16. The planographic printing plate precursor according to claim 13, wherein the polymer having a structural unit represented by general formula (1) contains the structural unit represented by general formula (1) in an amount of 5 mass% or more.

17. The planographic printing plate precursor according to claim 13, wherein the polymer having a structural unit represented by general formula (1) has a weight average molecular weight of from 1,000 to 500,000.

18. The planographic printing plate precursor according to claim 13, wherein the amino compound comprises a structure represented by the following general formula (I):

General formula (I)

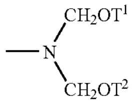

wherein in general formula (I), $T^1$ and $T^2$ each independently represents a hydrogen atom, an alkyl group, an alkenyl group, an acyl group, or an acetyl group.

* * * * *